United States Patent [19]
Sakata et al.

[11] Patent Number: 6,147,901
[45] Date of Patent: Nov. 14, 2000

[54] SEMICONDUCTOR MEMORY OPERATING ELECTRICALLY AND OPTICALLY, RETAINING INFORMATION WITHOUT POWER SUPPLY

[75] Inventors: Haruhisa Sakata, Tokyo; Yasuyuki Nagao, Hasuda; Yuichi Matsushima, Tokorozawa, all of Japan

[73] Assignee: KDD Corporation, Tokyo, Japan

[21] Appl. No.: 09/227,618

[22] Filed: Jan. 8, 1999

[30] Foreign Application Priority Data

Jan. 9, 1998 [JP] Japan .................................. 10-003471
Jan. 5, 1999 [JP] Japan .................................. 11-000481

[51] Int. Cl.[7] .................................................. G11C 11/36
[52] U.S. Cl. ........................................... 365/175; 365/106
[58] Field of Search ..................... 365/106, 112, 365/107, 171, 173, 175; 257/25, 85, 113

[56] References Cited

U.S. PATENT DOCUMENTS 4,813,016  3/1989  Okada ..................................... 365/107
4,972,370  11/1990  Morimoto .............................. 365/106
5,144,397  9/1992  Tokuda ..................................... 357/30
5,663,572  9/1997  Sakata ..................................... 257/25

*Primary Examiner*—A Zarabian
*Attorney, Agent, or Firm*—Olson & Hierl, Ltd.

[57] ABSTRACT

The present invention provides a semiconductor memory capable of retaining information after removing a power supply and of storing information with an optical input. A memory cell is comprising an n-InP substrate, a first semiconductor (n-InGaAs) layer, a second semiconductor (i-InGaAs) layer, a third semiconductor (p-InGaAs) layer, a fourth semiconductor (i-InGaAs) layer and a fifth semiconductor (n-InGaAs) layer. The first to fifth semiconductor layers are stacked in this order on the n-InP substrate. A bias voltage is applied between the n-InP substrate and the fifth semiconductor layer to control a height of a TBD formed in the above multi-layer structure so that carriers may move and electrons can be stored in one of the second and fourth semiconductor layers.

20 Claims, 25 Drawing Sheets

SEMICONDUCTOR MEMORY OPERATING ELECTRICALLY AND OPTICALLY, RETAINING INFORMATION WITHOUT POWER SUPPLY

BACKGROUND OF THE INVENTION

1. Field of the Invention

The present invention relates to a semiconductor memory capable of writing information electrically and optically, which is strongly required in the field of data processing and exchanging.

2. Description of the Related Art

In the field of the data processing technology such as a computer system and data communication, information recording and storing technologies occupy the most important position therein. A recent remarkable success, realizing a higher grade and a higher speed in the information processing technology is achieved greatly by the developments in various data storage technologies, where the data storage technologies are progressing to have a higher speed and a greater capacity.

Among those, semiconductor memories including DRAMs are progressing remarkably, and start to enter an era of gigabit memories. The DRAM increases extremely its integration density by migrating from an initial structure which includes a plural of transistors in one cell to a structure which consists of one transistor per one cell. In the gigabit memory era, however, a capacitance of storage capacitor is not sufficient even though adapting a trench structure and a stacked structure. Various approaches such as the use of a high dielectric constant material as capacitor insulated layers are attempted, but leaving the problems which are insoluble technically up to now. Such conventional DRAMs with the trench or stacked structure as well as DRAMs employing the high dielectric constant material for storage capacitor may require complicated fabrication processes and expensive manufacturing equipments. A cost from some ten billions to over than one trillion Japanese Yens is estimated to be necessary for realizing a manufacturing line which can perform a mass production of semiconductor memories with an improved integration density. Moreover, as the conventional DRAM is designed essentially on the basis of a plane (two-dimensional) layout, it is now unable to perform a further miniaturizing by means of a lithography technology. Thus, a technical barrier appears on the conventional semiconductor memory technologies, which mainly focus on the DRAM, and a break through against this technical barrier is required.

An optical computer has been proposed for many years, but has not been very important so far because the conventional silicon (Si) based semiconductor integrated circuit can operate with a higher speed than that is expected. However, as the problem of propagation delay on interconnections becomes significant, causing fatal drawbacks in the semiconductor integrated circuit with the higher integration density, the optical computer is now spotlighted again. The known semiconductor memory including such as DRAMs has no function for writing information directly with an optical input. From this point, a new plan is also required for the semiconductor memory.

An electronic or optical device (memory) which has a structure of n-i-p-i-n or p-i-n-i-p is proposed as a means to seek the new plan. The proposed semiconductor device using an InGaAs-based compound semiconductor, which has the n-i-p-i-n structure and employs an electrically bistable function of triangle barrier diode (TBD) type will be explained below. FIG. 1 shows a band diagram at zero bias of the proposed semiconductor memory which has the n-i-p-i-n structure. The numeral reference 501 denotes an n-InP layer, 502 an n-InGaALAs layer or n-InGaAsP layer (thickness: about 1–2 $\mu$m), 503 an i-InGaAlAs layer or i-InGaAsP layer (thickness: about 1–2 $\mu$m), 504 a p-InGaAlAs layer or p-InGaAsP layer (thickness: about 6 $\mu$m), 505 an i-InGaAlAs layer or i-InGaAsP layer (thickness: about 50–200 nm) and 506 an n-InGaAlAs layer or n-InGaAsP layer (thickness: about 0.1–0.5 $\mu$m), respectively. A broken line represents a Fermi energy level ($E_F$). The n-InP layer corresponds to a drain region 3. The p-InGaAlAs layer (or p-InGaAsP layer) 504 corresponds to a gate region 2. The n-InGaAlAs layer (or n-InGaAsP layer) 506 corresponds to a source region 1.

FIG. 2 shows a band diagram in the case where a bias voltage $V_O$ is applied to the n-InP layer 501, and a positive gate voltage $V_G$ is applied to the p-InGaAlAs layer (or p-InGaAsP layer) 504. When the bias voltage is increased, an energy barrier height $\Delta E_C$ between the source region 1 and the gate region 2 decreases so that electrons (majority carriers) in the n-InGaAlAs layer (or n-InGaAsP layer) 506 serving as the source region 1 may surmount beyond the barrier, and cause a current flow $I_r$. During this action, in the conventional n-i-p-i-n structure device, an "electron avalanche" is caused in the i-InGaAlAs layer (or i-InGaAsP layer) 503, and electrons which moved beyond the gate region 2 cause the electron avalanche to generate holes. The resultant holes move toward the gate region 2 and are stored therein, decreasing the potential in the gate region 2 and reducing the energy barrier height $\Delta E_C$. As a result, further electrons may move beyond the barrier, causing a further electron avalanche to generate holes. Such a positive feedback may increase the current intensity and cause a negative resistance. The holes stored in the gate region 2 can move through it with a high speed toward the source region 1 because of a thin thickness of the gate region 2. FIG. 3 shows a current-gate voltage characteristic of the semiconductor memory having the n-i-p-i-n structure as shown in FIGS. 1 and 2. The bistable characteristic is obtained by increasing and decreasing the gate voltage. FIG. 4 is a timing chart showing a memory characteristic of the conventional semiconductor memory having the n-i-p-i-n structure. The memory characteristic appears in the current $I_t$ in accordance with set and reset pulses of the gate voltage $V_G$.

As described above, the technical barrier now appears on the conventional semiconductor memory technologies. The necessity of extremely complicated processes for producing the conventional semiconductor memory trends to increase more and more. The more miniaturizing the device, the more increasing the difficulty in an accelerated manner. Furthermore, the conventional semiconductor memory such as the Si-DRAM has no function for writing information directly from with the optical input. In addition, although the triangle barrier diode (TBD) type electronic or optical device having the n-i-p-i-n or p-i-n-i-p structure has a writing function which uses the electrically bistable function, there is a problem that the stored content disappears after removing the power supply.

SUMMARY OF THE INVENTION

The present invention is made in consideration of the above problems and has an object to provide a new semiconductor memory which has a function to retain the stored content for a certain time period after removing the power supply by employing a TBD type device.

Another object of the present invention is to provide a semiconductor memory capable of writing and erasing electrically and/or optically in a high speed and of not loosing the stored content for a certain time period after removing the power supply.

A further object of the present invention is to provide a semiconductor memory also capable of reading electrically and/or optically in a high speed.

A further object of the present invention is to provide a semiconductor memory capable of being manufactured with relatively easier fabrication processes and lower costs.

A further object of the present invention is to provide a semiconductor memory having a simple structure capable of being miniaturized with ease.

A further object of the present invention is to provide a semiconductor memory capable of being employed as a computer's main memory not requiring constantly the power supply and of performing operations such as arithmetic operations, making use of its information retaining characteristic.

A further object of the present invention is to provide an integrated circuit capable of performing miscellaneous arithmetic operations and to provide a semiconductor memory for an optical computing with the use of optical writing and reading modes.

To achieve the above objects, a first feature of the present invention lies in a semiconductor memory having a unit cell which comprises, a first semiconductor layer of a first conductivity type, a second semiconductor layer of an intrinsic type, a third semiconductor layer of a second conductivity type, a fourth semiconductor layer of the intrinsic type, and a fifth semiconductor layer of the first conductivity type. The first to fifth semiconductor layers are stacked in this order from top or bottom. Further, the third semiconductor layer is held in a floating state, and a voltage is applied between the first and fifth semiconductor layers, whereby a height of TBD potential barrier that is formed between the third semiconductor layer and an adjacent semiconductor layer (the intrinsic type semiconductor layers on both sides) is varied with a polarity and a level of the voltage. The "second conductivity type" means a conductivity type opposite to the "first conductivity type". The second conductivity type is either n-type or p-type; if the second conductivity type is n-type the first conductivity type is p-type; and if the second conductivity type is p-type the first conductivity type is n-type. In consideration of practical technical level of crystal growth methods, the "intrinsic type" should be interpreted as a meaning which includes such a conductivity type as so cold "non-doped semiconductor layer", or "a semiconductor layer which has not been doped with impurities intentionally". The "intrinsic type semiconductor layer" may include "a semiconductor layer having a high resistivity" such as a semi-insulating semiconductor layer. The following explanation will be made with defining the first conductivity type as n-type and the second conductivity type as p-type for convenience sake, however, it may be easily understood to replace these conductivity types with each other. Hereinafter, the intrinsic type semiconductor layer may be abbreviated as "i-layer". The semiconductor memory according to the present invention has a TBD structure which includes a n-i-p-i-n, p-i-n-i-p, n-i-p-i-p-i-n or p-i-n-i-n-i-p structure. The device can accomplish a writing operation by causing an avalanche multiplication in the i-layers on both sides of the p-layer in the structure and storing electrons or holes within the i-layers on both sides of the p-layer. In particular, in the first feature of the present invention, it is also desirable to change a potential barrier height under a light irradiation. Thus, it becomes possible to store charges either in the second or fourth semiconductor layer by controlling the potential barrier height, whereby information can be retained in accordance with the stored state of charge. That is, a current-voltage (I-V) characteristic between the first and fifth semiconductor layers, which represents an S-shaped negative resistance according to the stored state of the charge in the second or fourth semiconductor layer, may be available. The S-shaped characteristics are present in both positive and negative polarities. A level of threshold voltage of the S-shaped characteristic can also be used as a stored content.

According to the first feature of the present invention, it is possible to confine electrons or holes within the semiconductor layer for a long time period by applying a sufficient high electric field across the internal i-layer for providing electrons or holes with a large energy. Information may be written with only an electric input or a light input. Reading may also be performed electrically and optically both in a high speed. This writing/reading method may be used for memories in various types. The optical writing and optical reading may make it possible to apply in an extreme variety of optical logical arithmetic devices and optical computing systems, and the technical advantages thereof may be expected greatly in the field of the information processing. In addition, if the device structure includes a light-absorbing layer and a light-emitting device or a light-modulating device mounted on the substrate or monolithically integrated on the same semiconductor substrate, it may be possible and useful to operate as an optical memory or an optical integrated circuit. In the case where the devices are arranged in two-dimension or vertically, a memory having a two- or three-dimensional structure may be realized. For example, a plurality of unit cells according to the first feature of the present invention can be located at cross points in a matrix which consists of column lines and row lines crossing perpendicularly to each other, in which the first semiconductor layer is connected electrically to one of the column lines, and the fifth semiconductor layer is connected electrically to one of the row lines.

Although the conventional memory requires complicated fabrication processes in general, the memory according to the first feature of the present invention may be easily manufactured because the memory retention function is determined by layered structures, or the doping profiles, which can easily controlled by conventional or state-of-the-art crystal growth technologies. As the dimension control in the thickness direction is not limited by the lithography technique, it is possible to control the dimension with a accuracy of monomolecular layer order, and structures having atomscopic scales or mesoscopic scales can be easily manufactured. In particular, as the gate region is kept in a floating state, the structure thereof may be simplified, and no space and specific process for forming the electrodes is required. Therefore, it is easy to scale the device in the plane direction. Further, it is possible to use the present device as a main memory not requiring constantly the power supply, and to perform arithmetic operation and the like using the most of the information-retaining properties.

A second feature of the preset invention lies in a semiconductor memory having a multi-layer structure which comprises, a first semiconductor layer of a first conductivity type, a second semiconductor layer of an intrinsic type, a third semiconductor layer of a second conductivity type, a fourth semiconductor layer of the intrinsic type, a fifth semiconductor layer of the first conductivity type, a sixth semiconductor layer of said intrinsic type, a seventh semiconductor layer of the second conductivity type, an eighth semiconductor layer of the intrinsic type and a ninth semiconductor layer of the first conductivity type. The first to ninth semiconductor layers are stacked in this order from top or bottom. The seventh semiconductor layer is held in a floating state, and a voltage is applied between the ninth and fifth semiconductor layers, whereby a first potential barrier height formed between the seventh semiconductor layer and each adjacent semiconductor layer (the intrinsic type semiconductor layers on both sides) is varied with a polarity and a level of the voltage. The third semiconductor layer is held in a floating state, and another voltage is applied between the first and fifth semiconductor layers, whereby a second potential barrier height formed between the third semiconductor layer and each adjacent semiconductor layer (the intrinsic type semiconductor layers on both sides) is varied with a polarity and a level of the other voltage.

The structure of the second feature is a structure in which the unit cells (memory cells) as described in the first feature are stacked vertically. The ninth semiconductor layer corresponds to a first drain region of a first unit cell, the first semiconductor layer corresponds to a second drain region of a second unit cell, and the fifth semiconductor layer corresponds to a common source region of the first and second unit cells. Thus, a three-dimensional device can be obtained by aligning devices (unit cells) vertically. It is also desirable, in particular, to vary the first and second potential barrier heights under light irradiation. Thus, charges can be stored in the sixth or eighth semiconductor layer by controlling the first potential barrier height, and in the second or fourth semiconductor layer by controlling the second potential barrier height, whereby information can be retained in accordance with the stored states of the charges. A plurality of the multi-layer structures according to the second feature of the present invention may be located at cross points in a matrix which consists of first and second column lines and row lines crossing perpendicularly to the first and second column lines. A three-dimensional matrix can be formed by connecting electrically one of the first column lines with the first semiconductor layer, one of the second column lines with ninth semiconductor layer, and one of the row lines with the fifth semiconductor layer, respectively.

In the second feature of the present invention, a current-voltage (I-V) characteristic between the first and fifth semiconductor layers exhibits an S-shaped negative resistance depending on the stored states of the charges in the second and fourth semiconductor layers, and the I-V characteristic between the fifth and ninth semiconductor layers exhibits another S-shaped negative resistance depending on the stored states of the charges in the sixth and eighth semiconductor layers. These characteristics are available for retaining information. The S-shaped characteristics exist in both positive and negative polarities. A level of threshold voltage of the S-shaped characteristic may be used as a stored information. According to the second feature of the present invention, it is possible to confine electrons or holes within the semiconductor layer for a long time period by applying an adequately high electric field across the internal i-layer for providing electrons or holes with a large energy. Information may be written with only an electric input or an optical input. Reading may also be performed electrically and optically both in a high speed. This writing/reading method may be used for memories in various types. The optical writing/reading may make it possible to apply in an extreme variety of optical logical arithmetic devices and optical computing systems, and the effectiveness thereof may be expected greatly in the information processing field.

In addition, if the device structure includes a light-absorbing layer and a light-emitting device or a light-modulating device, it may be useful to operate as an optical integrated circuit.

The memory according to the second feature of the present invention may be easily manufactured because the data retention function, or the memory function is determined by a doping profiles, which is easily controlled by epitaxial growth technologies to obtain the structures having atomscopic or mesoscopic scales. In particular, as the gate regions are kept in floating states, the structure thereof may be simplified, and no space and specific fabrication process for forming the electrodes is required. Further, it is possible to use the present device as a main memory not constantly requiring the power supply in a computer system, performing the arithmetic operations and the like, employing the long data retention properties.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing the invention in practice.

DETAILED DESCRIPTION OF THE PREFERRED EMBODIMENTS

Figure 1:
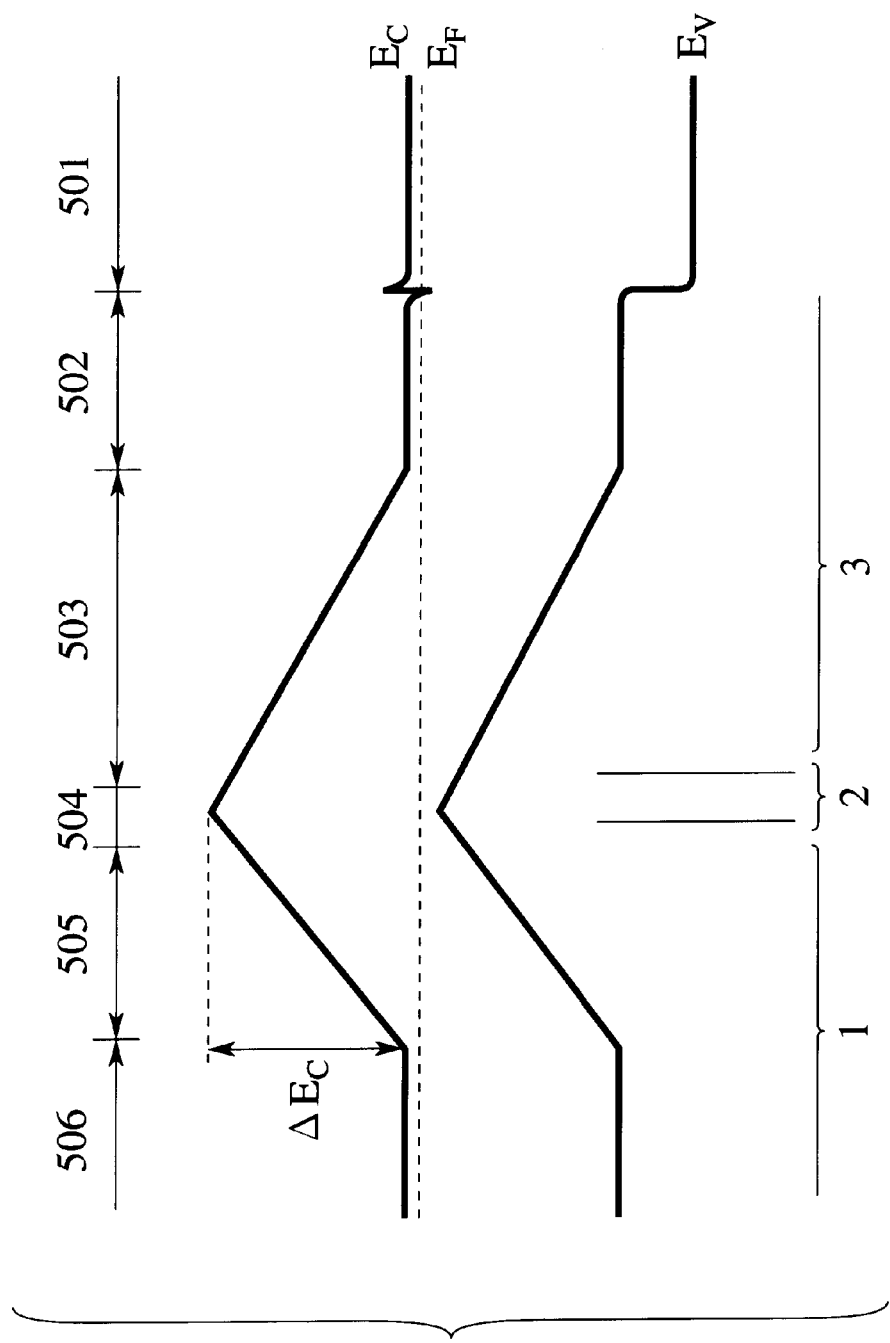
FIG. 1 is a band diagram of a conventional semiconductor memory at zero bias.
Figure 2:
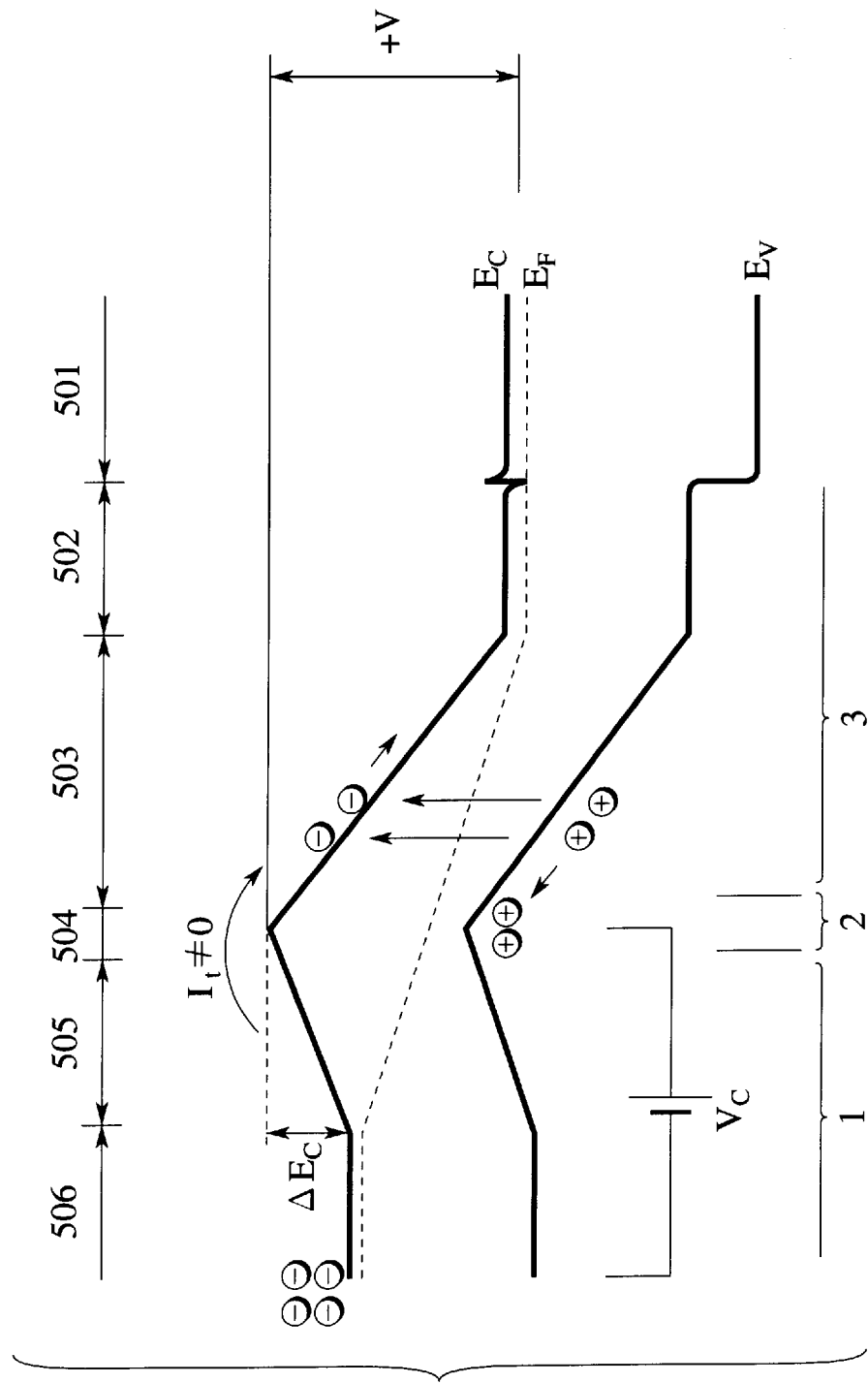
FIG. 2 is a band diagram of the conventional semiconductor memory when a bias is applied.
Figure 3:
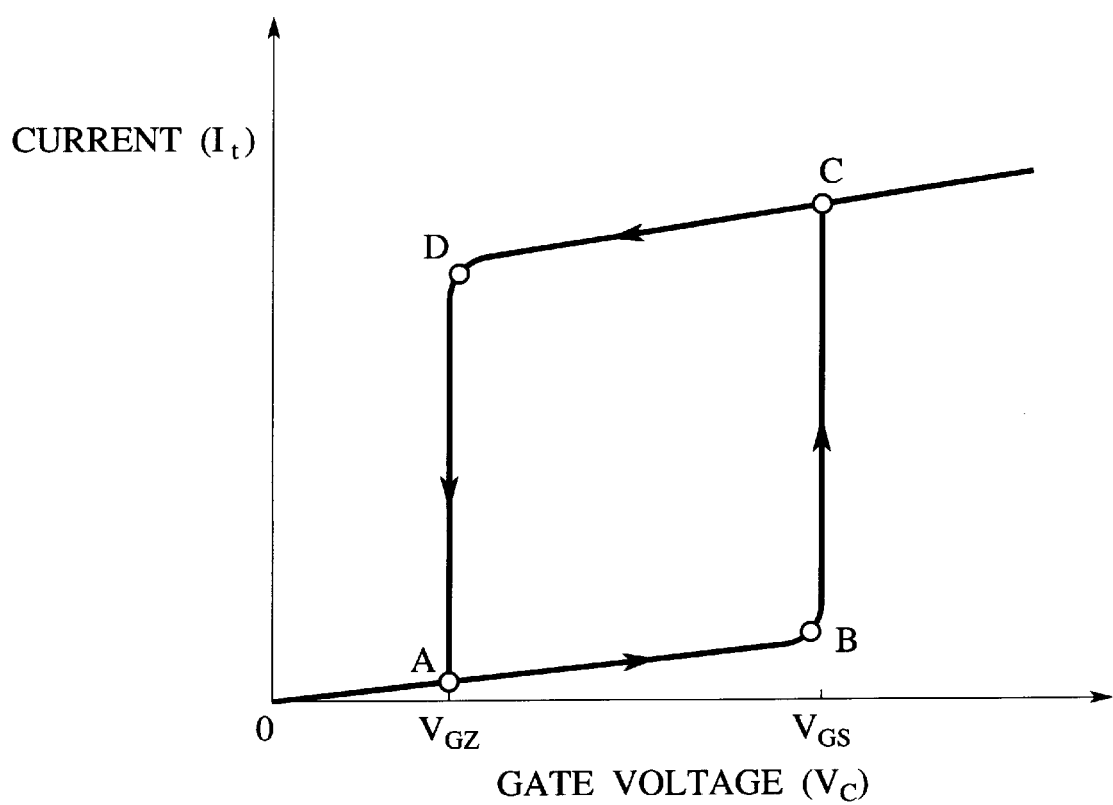
FIG. 3 is a diagram showing a current-voltage characteristic of the conventional semiconductor memory.
Figure 4:
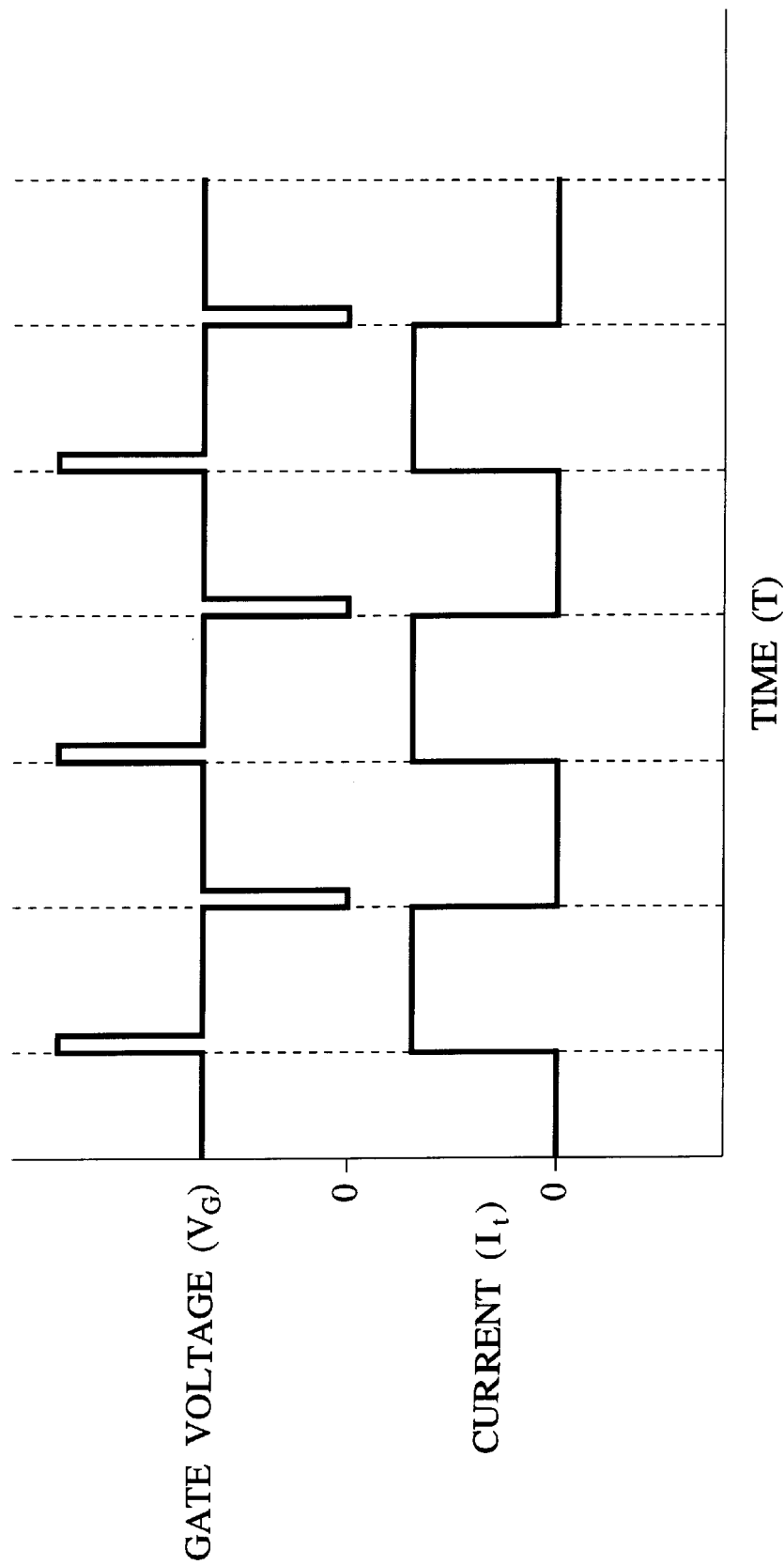
FIG. 4 is a timing chart showing a memory characteristic of the conventional semiconductor memory.

Various embodiments of the present invention will be described with reference to the accompanying drawings. It should be noted that the same or similar reference numerals are applied to the same or similar parts and elements throughout the drawings, and the description of the same or similar parts and elements will be omitted or simplified. Generally and is conventional in the representation of semiconductor devices, it will be appreciated that the various drawings are not drawn to scale from one figure to another nor inside a given figure, and in particular that the layer thickness is arbitrarily drawn for facilitating the reading of the drawings.

FIRST EMBODIMENT

Figure 5:
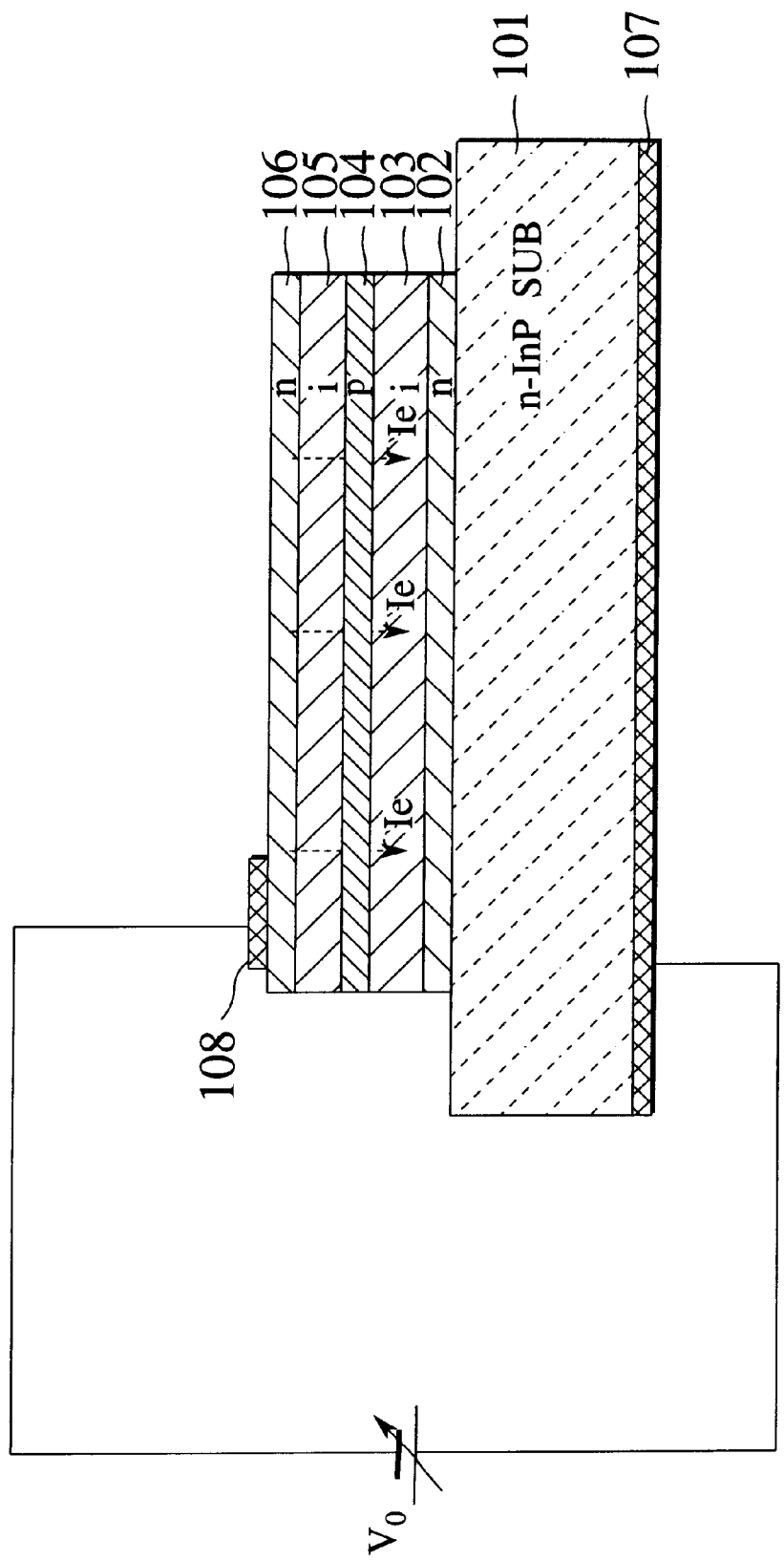
FIG. 5 is a schematic cross sectional view showing a unit cell of a semiconductor memory according to the first embodiment of the present invention.

FIG. 5 is a schematic cross sectional view showing a unit cell (memory cell) of the semiconductor memory according to a first embodiment of the present invention. The memory cell shown in FIG. 5 is comprising an n-InP substrate 101 a first semiconductor layer of an n-InGaAs layer (thickness: about 1 μm; impurity concentration: $2.0 \times 10^{18}$ cm$^{-3}$) 102, a second semiconductor layer of an i-InGaAs layer (thickness: about 0.5 μm) 103, a third semiconductor layer of a p-InGaAs layer (thickness: about 6 nm; impurity concentration: $2.0 \times 10^{18}$ cm$^{-3}$) 104, a fourth semiconductor layer of an i-InGaAs layer (thickness: about 0.5 gm) 105 and a fifth semiconductor layer of an n-InGaAs layer (thickness: about 1 μm; impurity concentration: $2.0 \times 10^{18}$ cm$^{-3}$) 106. The first to fifth semiconductor layers are stacked on the top surface of the n-InP substrate 101 in this order from the bottom. On the contrary to the literal definition, the i-InGaAs layers 103 and 105, in consideration of the current practical crystal growth technologies, should be interpreted as InGaAs layers having an impurity concentration of $1.6 \times 10^{16}$ cm$^{-3}$ or less. A source electrode 108 is formed on the top surface of the n-InGaAs layer 106, and a drain electrode 107 is formed on the bottom surface of the n-InP substrate 101. The n-InP substrate 101 corresponds to a drain region, and the n-InGaAs layer 106 corresponds to a source region. The p-InGaAs layer 104 serves as a gate region, and the gate region 104 is kept in a floating state. A bias voltage $V_O$ is applied between the source electrode 108 and the drain electrode 107.

Figure 6:
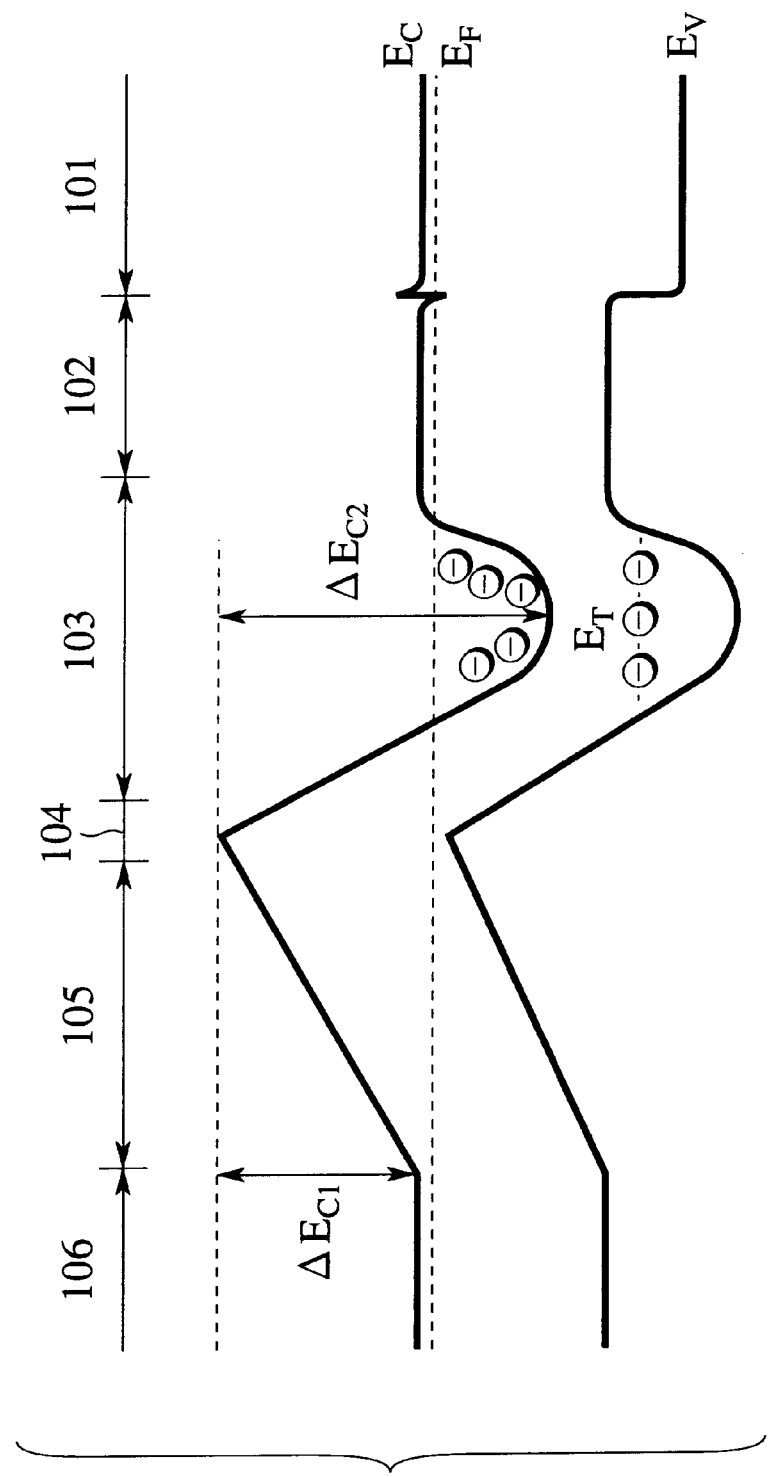
FIG. 6 is a band diagram of the unit cell of a semiconductor memory according to a first embodiment of the present invention at a zero bias.

FIG. 6 is a corresponding band diagram showing a potential at zero bias, in which each of the conduction band edge $E_c$ and the valence band edge $E_V$ in the n-InP substrate 101, n-InGaAs layer 102, i-InGaAs layer 103, p-InGaAs layer 104, i-InGaAs layer 105 and n-InGaAs layer 106 is shown from right in turn. A broken line in FIG. 6 denotes a Fermi energy level $E_F$. It is assumed that a trap level (or a trap center) $E_T$ is present in the forbidden gap (energy gap band) between the conduction and valence bands. The trap level $E_T$ may include a deep level laying around the gap center of the forbidden gap (energy gap band). Although a single level of the trap level $E_T$ is shown for convenience sake, it may possible to include plural trap levels $E_T$s each has different energy level. Further, the trap levels $E_T$ may be a composite including a generation-recombination center.

In the description of the essential functions of the semiconductor memory according to the first embodiment of the present invention, for convenience sake, it is assumed that charges have been already stored in the i-InGaAs layer 103 at zero bias so that the band structure has been asymmetry. Further, it is assumed that some electrons have been trapped at the trap level $E_T$ within the forbidden gap (energy gap band) of the i-InGaAs layer 103. In the case where the p-InGaAs layer 104 is considered as a barrier over which electrons may surmount, a barrier height seen from the n-InGaAs layer 106 is $\Delta E_{C1}$, and another barrier height seen from the i-InGaAs layer 103 is $\Delta E_{C2}$ ($\Delta E_{C1} < \Delta E_{C2}$).

Figure 7:
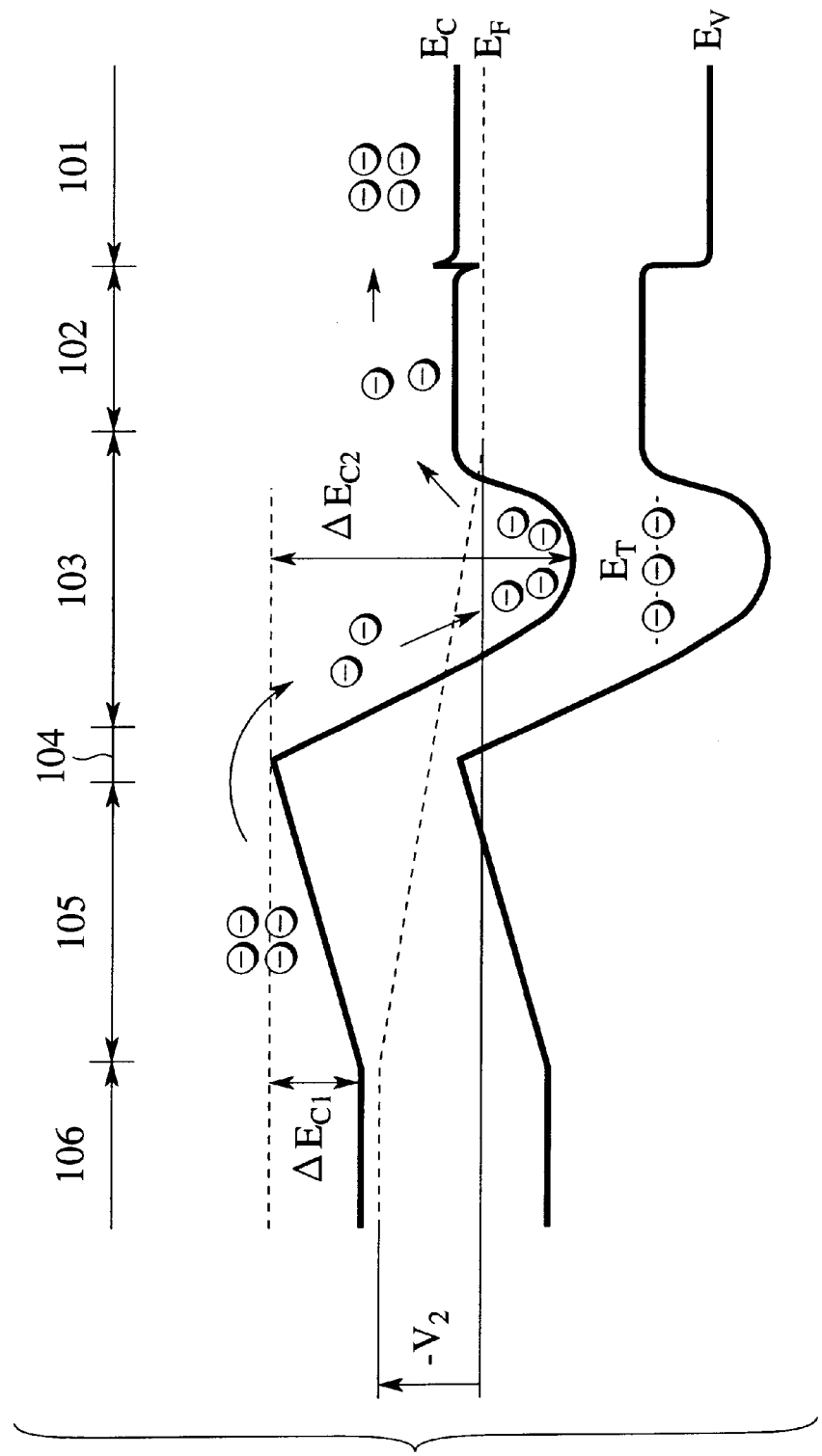
FIG. 7 is a band diagram of the unit cell of a semiconductor memory according to the first embodiment of the present invention when a negative bias is applied to a source region.

(a) FIG. 7 shows a case where a negative bias voltage $-V_2$ is applied to the n-InGaAs layer 106. At this moment, electrons or the majority carriers present in the n-InGaAs layer 106 can move beyond the energy barrier height $\Delta E_{C1}$ when a given voltage of $-V_2$ or more is applied, thus a current $I_e$ may flow.

Figure 8:
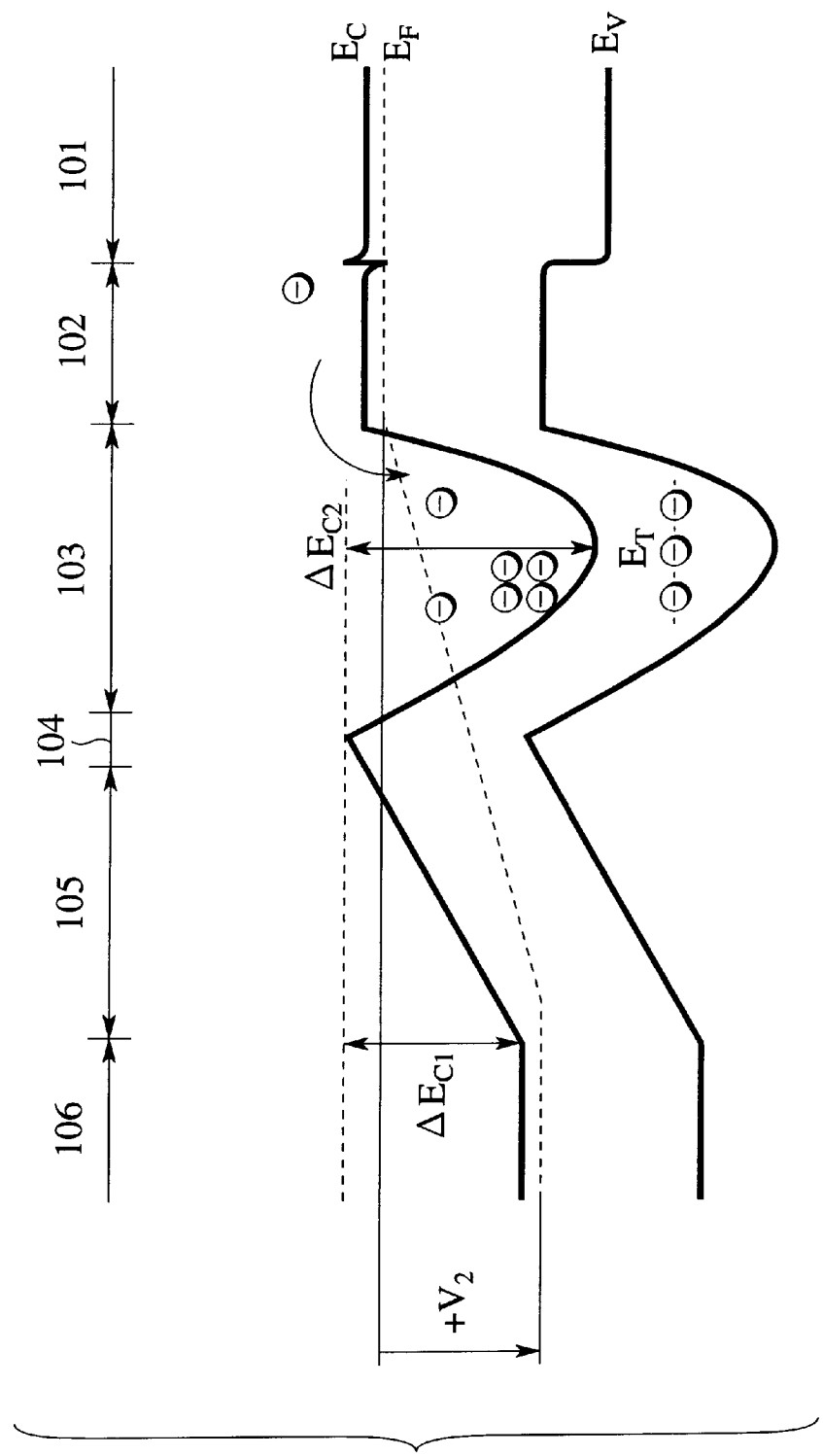
FIG. 8 is a band diagram of the unit cell of a semiconductor memory according to the first embodiment of the present invention when a positive bias ($+V_2$) is applied to the source region.

(b) FIG. 8 shows another case where a positive bias of $+V_2$ is applied to the n-InGaAs layer 106. At this moment, electrons or the majority carriers present in the i-InGaAs layer 103 can not move beyond the energy barrier height $\Delta E_{C2}$ when the voltage of $+V_2$ is applied, thus the current $I_e$ can not flow.

Figure 9:
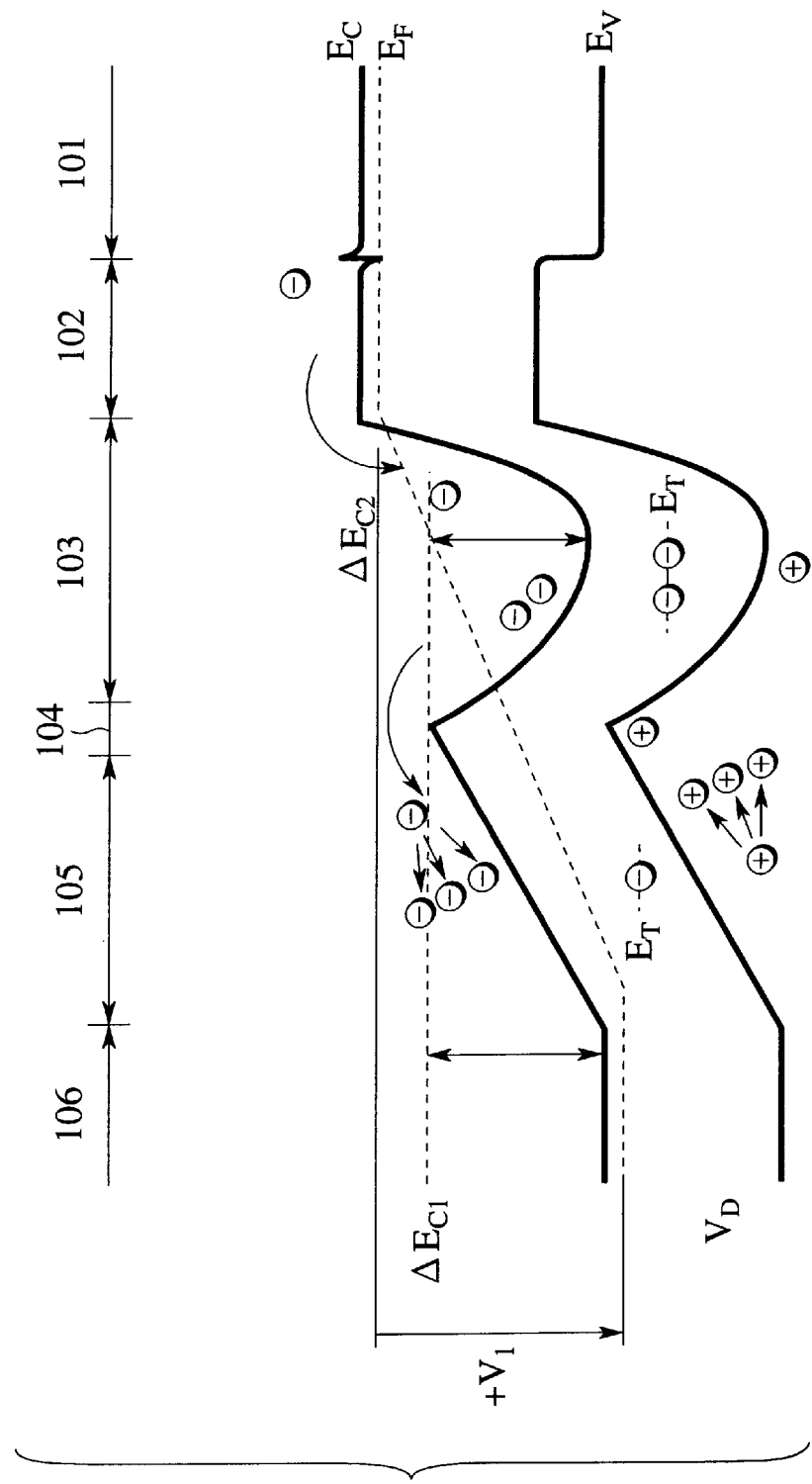
FIG. 9 is a band diagram of the unit cell of a semiconductor memory according to the first embodiment of the present invention when a higher positive bias ($+V_1$) is applied to the source region.

(c) FIG. 9 shows a further case where the bias voltage is increased. In the case where the bias voltage is increased up to $+V_1$ from $+V_2$, the energy barrier height $\Delta E_{C2}$ decreases, and electrons or the majority carriers present in the n-InGaAs layer 103 can move beyond the energy barrier, thus and the current $I_e$ may flow. At the moment, the electrons moved through the p-InGaAs layer 104 cause the electron avalanche in the i-InGaAs layer 105, generating a number of electrons and holes. The resultant holes move toward the p-InGaAs layer 104 or gate region and are stored therein, whereby the potential in the p-InGaAs layers 104 is reduced and the energy barrier height $\Delta E_{C2}$ is decreased. Thus, more electrons may move beyond the barrier and cause a further electron avalanche to generate holes. A negative resistance may be caused in a current-voltage characteristic by an abrupt increase of the current due to the above positive feedback. In the present invention, the voltage at which the current may start to flow is called a "threshold voltage". In the semiconductor memory of the first embodiment, the electrons having a large energy due to the avalanche multiplication are stored in the i-InGaAs layer 105. On the other hand, the electrons stored in the i-InGaAs layer 103 recombine with holes and disappear. At this moment, the electrons trapped at the trap level $E_T$ in the forbidden gap of the i-InGaAs layer 103 also disappear. The disappearance of the electrons trapped at the trap level $E_T$ in the i-InGaAs layer 103 may be considered due to the recombination with the generated holes. And some electrons are newly trapped at another trap level $E_T$ in the forbidden gap of the i-InGaAs layer 105, or the layer next to the p-InGaAs layer 104.

Figure 10:
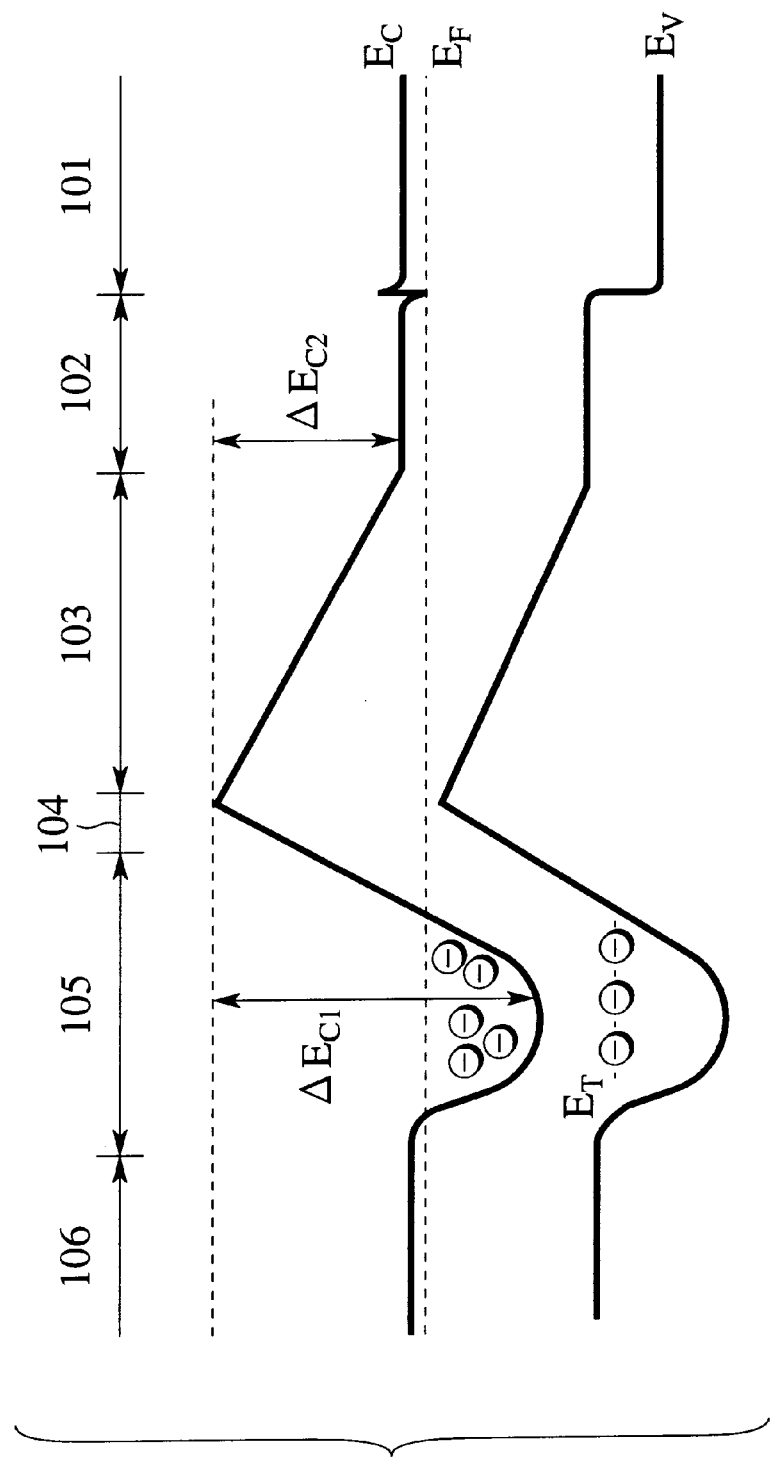
FIG. 10 is a band diagram of the unit cell of a semiconductor memory according to the first embodiment of the present invention when the zero bias is applied to the source region again.

(d) FIG. 10 shows a band diagram at zero bias again by removing the bias voltage. The asymmetry of the band becomes opposite to that at the time before the bias being applied because of the electrons stored in the i-InGaAs layer 105 (and some electrons are trapped at the trap level $E_T$ in the forbidden gap of the i-InGaAs layer 105). Thus, the relative magnitude of the energy barrier heights $\Delta E_{C1}$ and $\Delta E_{C2}$ is reversed compared with those at the time before the bias being applied. Therefore, a negative resistance may be caused when the n-InGaAs layer 106 is biased negatively, and the polarity of the threshold voltage is reversed.

As described above, applying a bias voltage higher than the threshold in the reversed polarity state, and causing the positive feedback due to the avalanche multiplication can store electrons in the i-InGaAs layer at the opposite side. It is possible to determine in which one of the i-InGaAs layers the electrons are stored, thus a memory operation which employs the stored state of the charges as retaining information may be realized. The stored state of the charges may be easily alternated with a state of the bias voltage.

Figure 11:
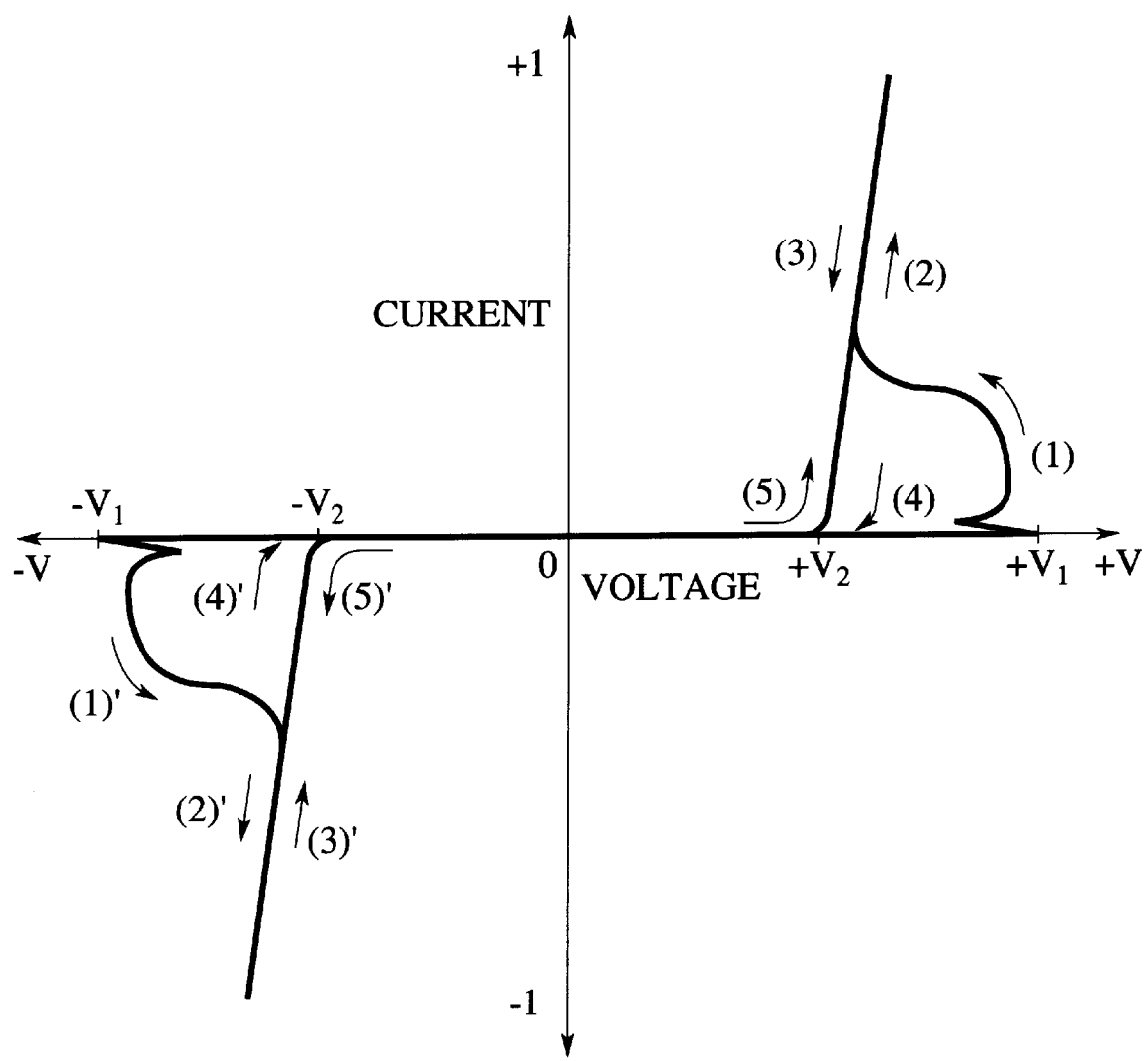
FIG. 11 is a diagram showing a current-voltage characteristic of the unit cell of a semiconductor memory according to the first embodiment of the present invention when the zero bias is applied to the source region again.

FIG. 11 shows a variation in the stored state of the charges due to the current-voltage characteristic. In the case where the charges are stored in the i-InGaAs layer 103, with increasing gradually a positive bias voltage, the characteristic exhibits a variation from a state where a current rarely flows when the bias voltage is still low to another state where a large current flows abruptly when the bias voltage excesses the threshold $+V_1$, thus an S-shaped negative resistance is caused. Once the current flows, the threshold voltage becomes $+V_2$. Thereafter, the current may start to flow at the voltage of $+V_2$ when the voltage is increased again. This process is depicted with ①→②→③→④→⑤. This is a state in which electrons are stored in the i-InGaAs layer 105. When the bias voltage is changed into a negative voltage from this state, a first threshold voltage appears at $-V_1$, and an S-shaped negative resistance is caused. Then, the threshold voltage becomes $-V_2$. This process is depicted with ①'→②'→③'→④'→⑤'. When the positive bias voltage is applied again, the threshold voltage returns to $+V_1$, and the process is depicted with ①→②→③→④→⑤. Thus, the threshold voltage may be altered by causing the negative resistance due to the avalanche multiplication. It is possible to determine in which one of the i-InGaAs layers electrons are stored by checking the value of the threshold voltage. This mechanism is available in the memory operation.

Figure 12:
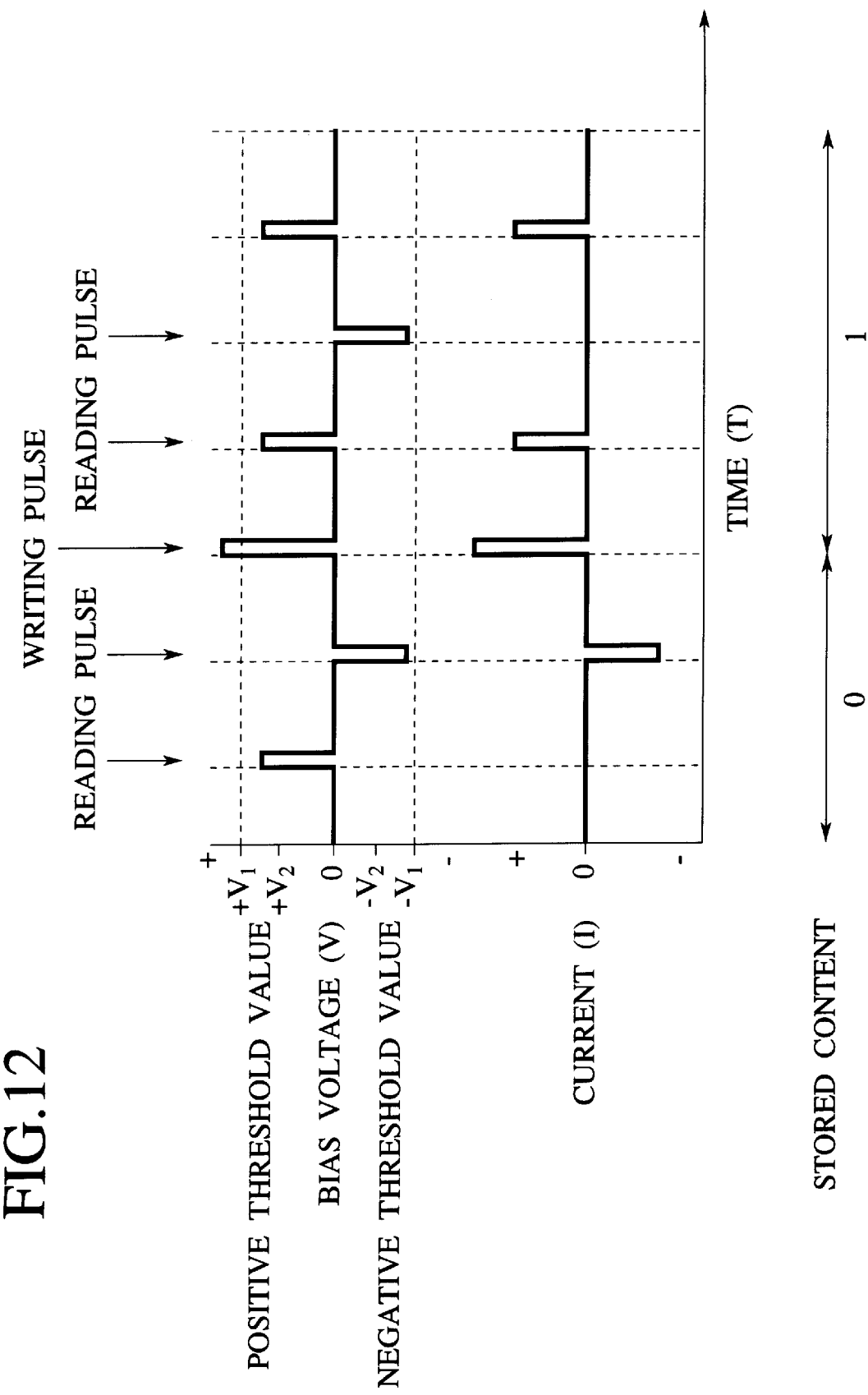
FIG. 12 is a timing chart explaining reading/writing operations of the unit cell of a semiconductor memory according to the first embodiment of the present invention.

FIG. 12 shows a timing chart in the case of a practical writing operation according to the first embodiment of the present invention. The device may become an on-state in a positive polarity when a bias voltage larger than the threshold voltage of $\pm V_1$ is applied. The stored content may be determined from an amount of the flowing current when a voltage smaller than the threshold voltage of $\pm V_1$ and larger than that of $\pm V_2$ is applied. Reset may be performed by applying a bias voltage larger than the threshold voltage of $\pm V_1$ having a polarity opposite to the writing state. The resultant state may be determined from an amount of the flowing current in accordance with a voltage smaller than the threshold voltage of $\pm V_1$ and larger than that of $\pm V_2$.

Figure 13:
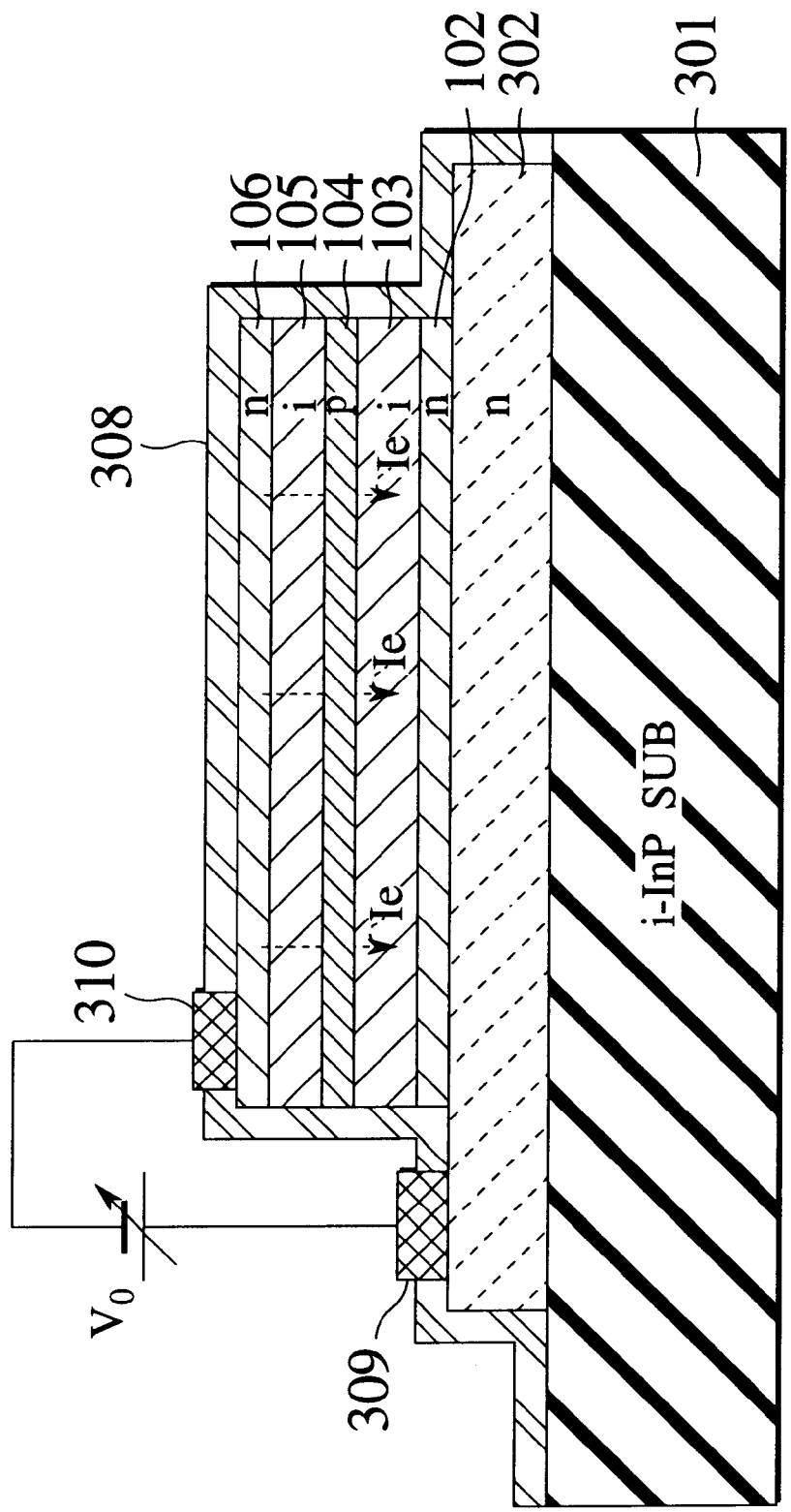
FIG. 13 is a schematic cross sectional view showing an embodied structure of the unit cell for constructing a memory cell array using the semiconductor memory according to the first embodiment of the present invention.

FIG. 13 is a schematic cross sectional view showing a unit cell (memory cell) structure of the semiconductor memory according to the first embodiment of the present invention, which can be employed to arrange an embodied memory cell array. The memory cell array is formed by employing a semi-insulating InP substrate or i-InP substrate 301, and disposing on the substrate an n-InP layer 302 having a thickness of 0.5 μm. A structure above the n-InP layer 302 is similar to that shown in FIG. 5. That is, there are disposed on the n-InP layer 302 an n-InGaAs layer (thickness: about 1 μm; impurity concentration: $2.0 \times 10^{18}$ cm$^{-3}$) 102, an i-InGaAs layer (thickness: about 0.5 μm) 103, a p-InGaAs layer (thickness: about 6 nm; impurity concentration: $2.0 \times 10^{18}$ cm$^{-3}$) 104, an i-InGaAs layer (thickness: about 0.5 μm) 105 and an n-InGaAs layer (thickness: about 1 μm; impurity concentration: $2.0 \times 10^{18}$ cm$^{-3}$) 106 in this stacking order. An insulating film (thickness: about 0.2 μm) 308 such as a silicon nitride film ($Si_3N_4$ film) is deposited on the n-InGaAs layer 106. A word line 310 makes an ohmic contact with the n-InGaAs layer 106 through a contact hole opened in the insulating film 308. On the other hand, a bit line 309 makes an ohmic contact with the n-InGaAs layer 302 through another contact hole opened in the insulating film 308.

Figure 14:
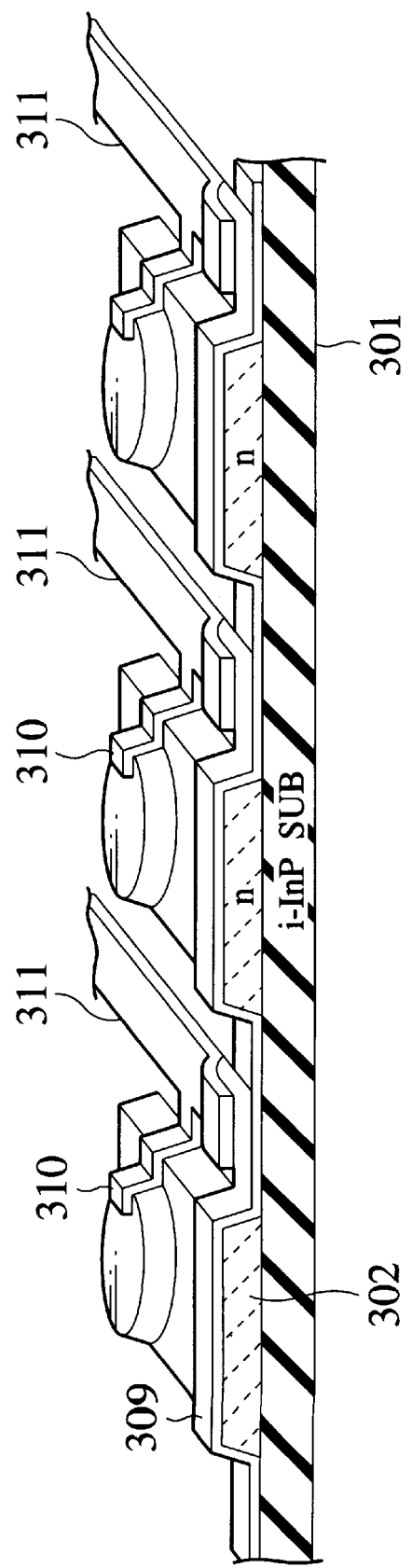
FIG. 14 is a bird's-eye view showing a memory cell array using the unit cell shown in FIG. 9.

FIG. 14 is a bird's-eye view showing a further embodied memory cell array having memory cells, each memory cell comprising the same stacked structure as shown in FIG. 13. Although FIG. 14 shows only three memory cells in a part of a raw, there is practically a matrix which consists of a plural of column lines (bit lines) 309 and a plural of row lines (word lines) 311 crossing perpendicularly to each other. A word electrode 310 which makes an ohmic contact with the n-InGaAs layer 106 is connected with the word line 311. As shown in FIG. 14, a plural of the semiconductor memories according to the first embodiment of the present invention are aligned on the semi-insulating substrate 301, and a trench is provided for isolating each device from others. Each memory cell is located at one of cross points of a matrix consisting of a plural of bit lines 309 and a plural of word lines 311, and is connected to one of the bit lines 309 and one of the word lines 311 so that the memory cell is randomly accessed.

The semiconductor memory shown in FIG. 14 is fabricated by employing a method such as a reduced pressure MOCVD, MBE, CBE (Chemical Beam Epitaxy) and MLE (Molecular Layer Epitaxy) for forming on the i-InP substrate 101, the n-InP layer 302, n-InGaAs layer 102, i-InGaAs layer 103, p-InGaAs layer 104, i-InGaAs layer 105 and n-InGaAs layer 106 (see FIG. 13). In the case where the CBE growth is employed, the InP layer 302 may be grown by introducing TMIn (trimethylindium) and PH$_3$ (phosphine) into a growth chamber, and the InGaAs layers 102, 103, 104 and 106 may be sequentially grown by introducing TEG (triethylgallium), TMIn and AsH$_3$ (arsine) into the same growth chamber at a pressure of 1.3×10$^{-3}$ Pa at a substrate temperature of 520° C. TBA (tertiary butyl arsine: (C$_4$H$_9$)AsH$_2$) may also be used instead of AsH$_3$. As a p-type dopant gas, DEZn (diethylzinc) and CP$_2$ Mg (biscyclopentadienylmagnesium), or a solid Be source may be used. As an n-type dopant gas, SiH$_4$ (monosilane), Si$_2$H$_6$ (disilane), DESe (diethylselenium) and DETe (diethyltellurium) may be available. The MLE is performed with an exchange surface reaction on the semiconductor substrate, which is caused by introducing the source gases used in the MLE alternately. As a molecular layer of InP can be grown in one gas introducing cycle which consists of an introduction of TMIn for 4 seconds, a vacuum evacuation for 3 seconds, an introduction of the PH$_3$ for 20 seconds and a vacuum evacuation for 3 seconds thereafter, the stacked wafer shown in FIG. 13 can be produced as a structure with an accuracy of a mono-molecular layer according to the MLE.

Next, delineating on the wafer a photoresist mask pattern for etching a U-groove to isolate devices, then etching the n-InGaAs layer 106, i-InGaAs layer 105, p-InGaAs layer 104, i-InGaAs layer 103, n-InGaAs layer 102 and n-InP layer 302 to form the U-groove (a first U-groove) by RIE or ECR ion etching method, using the mask pattern. Thereafter, delineating a new photoresist pattern by photolithography, which is used as a new etching mask pattern (bit line contact mask pattern) for making another U-groove (a second U-groove) that forms bit line contacts. Then, etching the n-InGaAs layer 106, i-InGaAs layer 105, p-InGaAs layer 104, i-InGaAs layer 103 and n-InGaAs layer 102 to form the second U-groove by a RIE or ECR ion etching method using the new etching mask pattern (bit line contact mask pattern). A trench may be formed with the first and second U-grooves as shown in FIG. 13. Although a dry etching method is employed as a main etching means herein, only wet etching can also be useful. An insulating film 308 such as a silicon nitride film (Si$_3$N$_4$) is deposited by CVD method over the entire surface. A bit line contact hole and a word line contact hole are opened in the insulating film 308. A bit line electrode 309 and a word line electrode 310 each consisting of a multilayered structure are formed by the so-called lift-off method. This method has the steps of depositing a metallic film such as AuGe/Ni/Ti/Au by vacuum evaporation or spattering method on the window parts of the remaining photoresist pattern for opening the bit line contact hole and the word line contact hole, and then removing the photoresist pattern. The bit line 309 is formed on the bottom of the trench. The fabrication process for forming the bit line 309 and the word electrode 310 may be divided into two steps, and they may be patterned by the RIE and so on. Thereafter, performing a heat treatment (sintering) at a temperature of about 350° C. in a lamp-annealing furnace in order to obtain electrical contacts between the bit line 309 and word line 310 as well as between the n-InP layer 302 and n-InGaAs layer 106. Next, forming an interlayer insulator on the bit line 309, then opening a contact hole in the interlayer insulator, and patterning the word line 311 to be connected with the word electrode 310. In this case, a prepolymer solution of a polyimide resin may be coated over the entire surface of the substrate by means of a spin coating method, and heated gradually up to a thermosetting temperature (350° C.) of the polyimide resin. As a result, the polyimide resin is formed over the entire surface to stuff the trench and even the surface on which the word line 311 may be patterned. Evening may also be performed by the chemical mechanical polishing (CMP) method, or etching back of the polyimide may be achieved by means of a method such as RIE which employs CF$_4$/O$_2$. An insulating film such as a silicon oxide film may be utilized instead of the polyimide resin. A device isolation may also be formed by proton (H$^+$) ion implantation instead of forming the trench (a groove with steps).

SECOND EMBODIMENT

Figure 15:
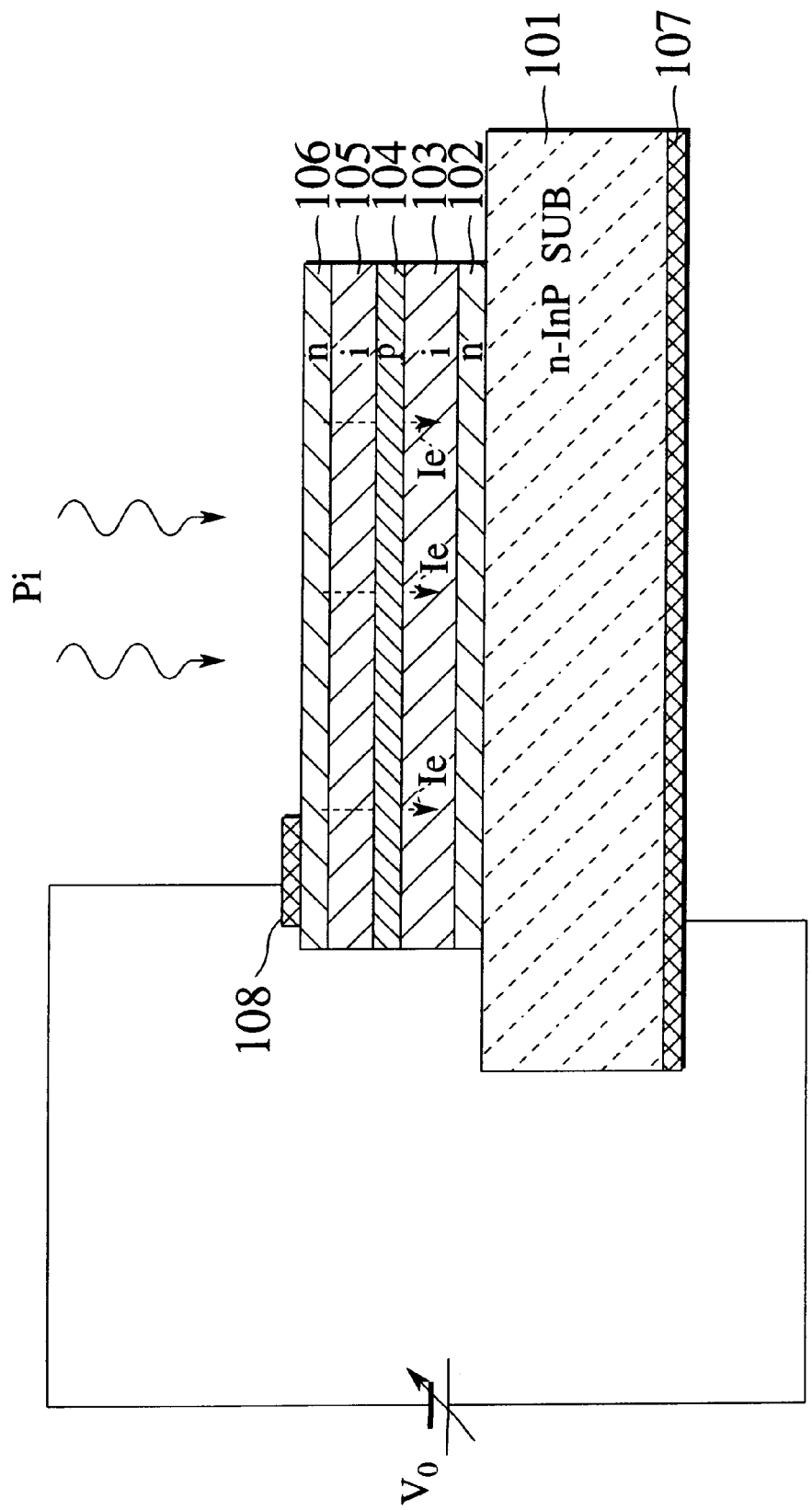
FIG. 15 is a schematic cross sectional view showing a unit cell of a semiconductor memory according to a second embodiment of the present invention.

A semiconductor memory capable of writing optically in both polarities using the InGaAs based semiconductor will now be explained as a second embodiment of the present invention. FIG. 15 is a schematic cross sectional view showing a unit cell (memory cell) of the semiconductor memory according to the second embodiment of the present invention. The memory cell of the semiconductor memory according to the second embodiment of the present invention is comprising a first semiconductor layer 102, a second semiconductor layer 103, a third semiconductor layer 104, a fourth semiconductor layer 105 and a fifth semiconductor layer 106 and an n-InP substrate 101. The first to fifth semiconductor layers are stacked on the n-InP substrate 101 in this order, as shown in FIG. 15. That is, an n-InGaAs layer (thickness: about 1 μm; impurity concentration: 2.0×10$^{18}$ cm$^{-3}$) 102, an i-InGaAs layer (thickness: about 0.5 μm) 103, a p-InGaAs layer (thickness: about 6 nm; impurity concentration: 2.0×10$^{18}$ cm$^{-3}$) 104, an i-InGaAs layer (thickness: about 0.5 μm) 105, and an n-InGaAs layer (thickness: about 1 μm; impurity concentration: 2.0×10$^{18}$ cm$^{-3}$) 106 are disposed on the n-InP substrate 101 in this order. The n-InP substrate 101 corresponds to a drain region, and the n-InGaAs layer 106 corresponds to a source region. A source electrode 108 is formed partially on the top surface of the n-InGaAs layer 106, and a drain electrode 107 is formed over the whole bottom surface of the n-InP substrate 101. The source electrode 108 is so formed to provide a large area of aperture to allow a light to enter the i-InGaAs layer 103 and the i-InGaAs layer 105 through the n-InGaAs layer 106. If the source electrode 108 comprises a transparent electrode of a complex film which consists of a thin Au film having a thickness of 1 to 5 nm and other films such as a SnO$_2$ film or an ITO film disposed thereon, the source electrode 108 may cover the whole surface of the n-InGaAs layer 106. The p-InGaAs layer 104 serves as a gate region. The gate region 104 is held in a floating state. A bias voltage V$_O$ is applied between the source electrode 108 and the drain electrode 107.

Figure 16:
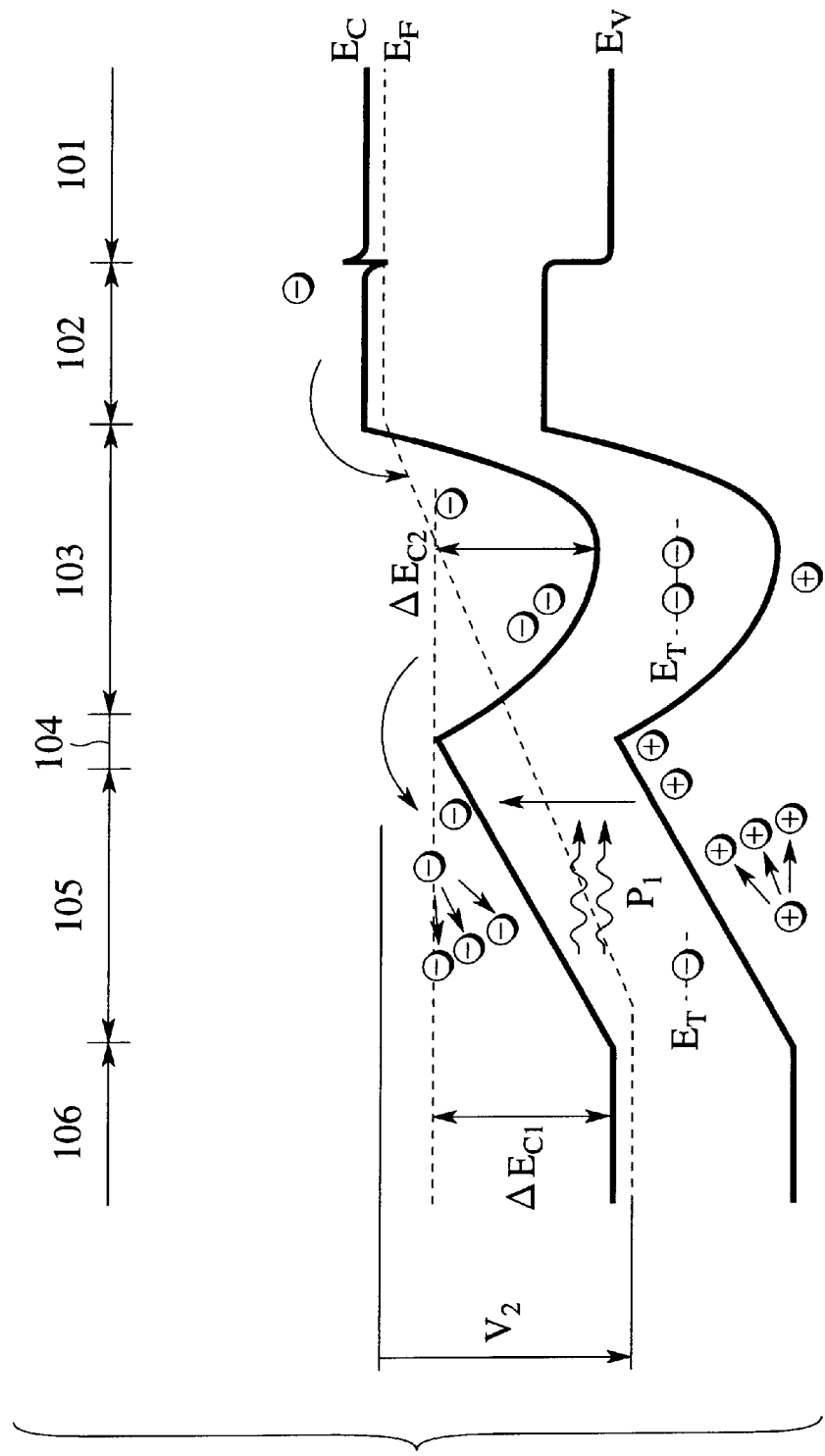
FIG. 16 is a band diagram of the unit cell of a semiconductor memory according to the second embodiment of the present invention when a positive bias ($+V_2$) is applied to the source region.

FIG. 16 is a corresponding band diagram showing a potential when a positive bias +V$_2$ is applied to the n-InGaAs layer 106 or the source region, in which each of the conduction band edge E$_C$ and the valence band edge E$_V$ in the n-InP substrate 101, n-InGaAs layer 102, i-InGaAs layer 103, p-InGaAs layer 104, i-InGaAs layer 105 and n-InGaAs layer 106 is shown from right in turn. It is assumed that a trap level (or a trap center) E$_T$ is present in the forbidden gap (energy gap band).

A broken line in FIG. 14 represents the Fermi energy level E$_F$. Here, the trap level E$_T$ may include a deep level formed around the gap center of the forbidden gap, and it may possible to include plural trap levels E$_T$s having different energy levels. And the trap levels E$_T$ may be a complex of a generation-recombination center and the trap center.

(1) In the explanation of the semiconductor memory according to the second embodiment of the present invention, it is assumed that charges are already stored in the i-InGaAs layer 103 at zero bias so that the band structure has been asymmetry (and some electrons have been trapped at the trap level $E_T$ within the forbidden gap of the i-InGaAs layer 103). In the case where the p-InGaAs layer 104 is considered as a barrier over which electrons must surmount in the band diagram at zero bias, a barrier height seen from the n-InGaAs layer 106 is $\Delta E_{C1}$, and another barrier height seen from the i-InGaAs layer 103 is $\Delta E_{C2}$ ($\Delta E_{C1} < \Delta E_{C2}$).

(2) In the case where a positive bias of $+V_2$ is applied to the n-InGaAs layer 106 as shown in FIG. 16, electrons or the majority carriers present in the i-InGaAs layer 103 can not move beyond the energy barrier height $\Delta E_{C2}$ when the voltage of $+V_2$ is applied, and the current $I_e$ may not flow. An external light input $P_i$ may generate electron-hole pairs in the i-InGaAs layer 105 as shown in FIG. 15. As a result, an electron avalanche may be caused in the i-InGaAs layer 105 to generate a number of electrons and holes. The resultant holes move toward the p-InGaAs layer 104 or a gate region and then are stored therein, reducing the potential of the p-InGaAs layer 104 and decreasing the energy barrier height $\Delta E_{C2}$. Thus, more electrons may move beyond the barrier from the i-InGaAs layer 103, causing further avalanches to generate holes. A negative resistance may be caused by an abrupt increase of the current due to such positive feed back. Similarly to the first embodiment, the voltage at which the current can start to flow is called a "threshold voltage". In the semiconductor memory of the second embodiment according to the present invention, the electrons having a large energy due to the avalanche multiplication are stored in the i-InGaAs layer 105, and the electrons stored in the i-InGaAs layer 103 recombine with holes and disappear. At the same time, the electrons that are trapped at the trap level $E_T$ in the forbidden gap of the i-InGaAs layer 103 also disappear. The disappearance of the electrons that are trapped at the trap level $E_T$ in the i-InGaAs layer 103 may be due to the recombination with the generated holes. Then some electrons are newly trapped at another trap level $E_T$ in the forbidden gap of the i-InGaAs layer 105.

(3) When removing the bias voltage again, the electrons are stored in the i-InGaAs layer 105, and the asymmetry of the band becomes opposite to that at zero bias. As the result, the relative relation of the magnitudes of $\Delta E_{C1}$, and $\Delta E_{C2}$ becomes opposite to those at the time of zero bias. Thus, the negative resistance may be caused when the n-InGaAs layer 106 is biased negatively, and the polarity of the threshold voltage is reversed.

As described above, it is possible to store electrons in the i-InGaAs layer at the opposite side by applying the bias voltage larger than the threshold voltage in a reverse-polarity, resulting the positive feedback due to the avalanche multiplication. Thus, it is possible to determine in which one of the i-InGaAs layers the electrons are stored, whereby a memory operation employing the stored states to retain information may be realized. The stored states may be easily alternated with a state of the bias voltage.

Figure 17:
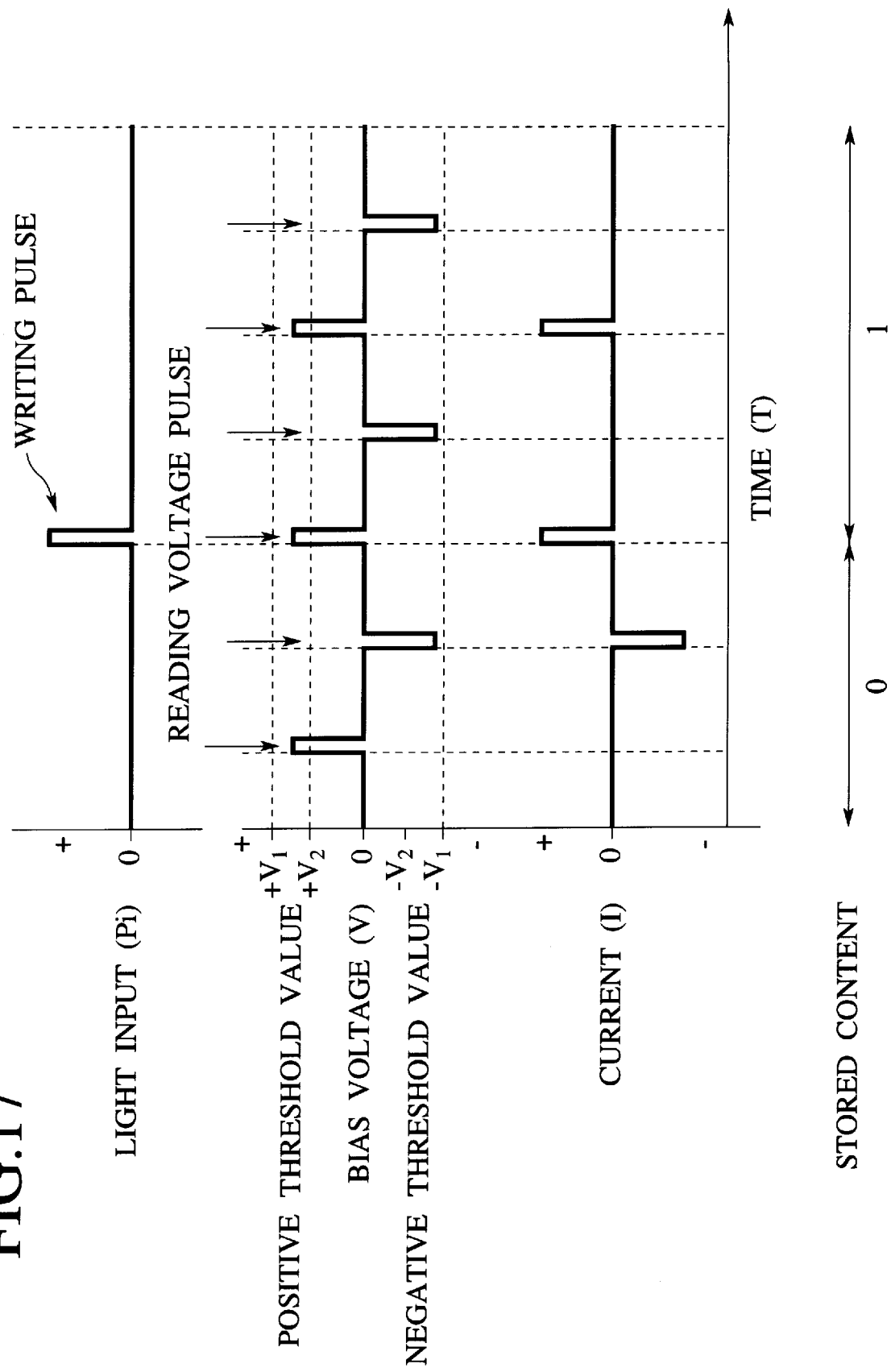
FIG. 17 is a timing chart explaining an information storing operation with a light input to the source region of the unit cell of the semiconductor memory according to the second embodiment of the present invention.

FIG. 17 shows a timing chart in the case of writing information with a light irradiation. According to the second embodiment of the present invention, it is possible to store information by supplying a light writing pulse in a state where a voltage smaller than the threshold voltage of $\pm V_1$ and larger than that of $\pm V_2$ is applied. Reset may be achieved by applying a bias voltage larger than the threshold voltage of $\pm V_1$ which has the opposite polarity to the writing state. The resultant state may be determined from an amount of a current flowing in accordance with a voltage smaller than the threshold voltage of $\pm V_1$ and larger than that of $\pm V_2$.

A memory cell array may be formed by disposing a plurality of memory cells having the multi-layer structure shown in FIG. 15 on a semi-insulating semiconductor substrate, similarly to the arrangement shown in FIGS. 13 and 14. A matrix is constructed by crossing a plural of column lines (bit lines) and a plural of row lines (word lines) running perpendicularly to each other. The n-InGaAs layer 106 is connected with the word line, and the n-InGaAs layer 102 with the bit line. A matrix consisting of optical devices which includes a light emitting device such as a LED and a semiconductor laser or a light modulating device and faces to the memory cell array may be disposed on (above) the substrate 101 for supplying a light pulse to each cell. Each unit cell (memory cell) of the semiconductor memory according to the second embodiment of the present invention may be individually accessed at random if the unit cells are arranged at the cross points of the matrix which consists of a plural of the bit lines and a plural of the word lines crossing perpendicularly to each other.

THIRD EMBODIMENT

Figure 18:
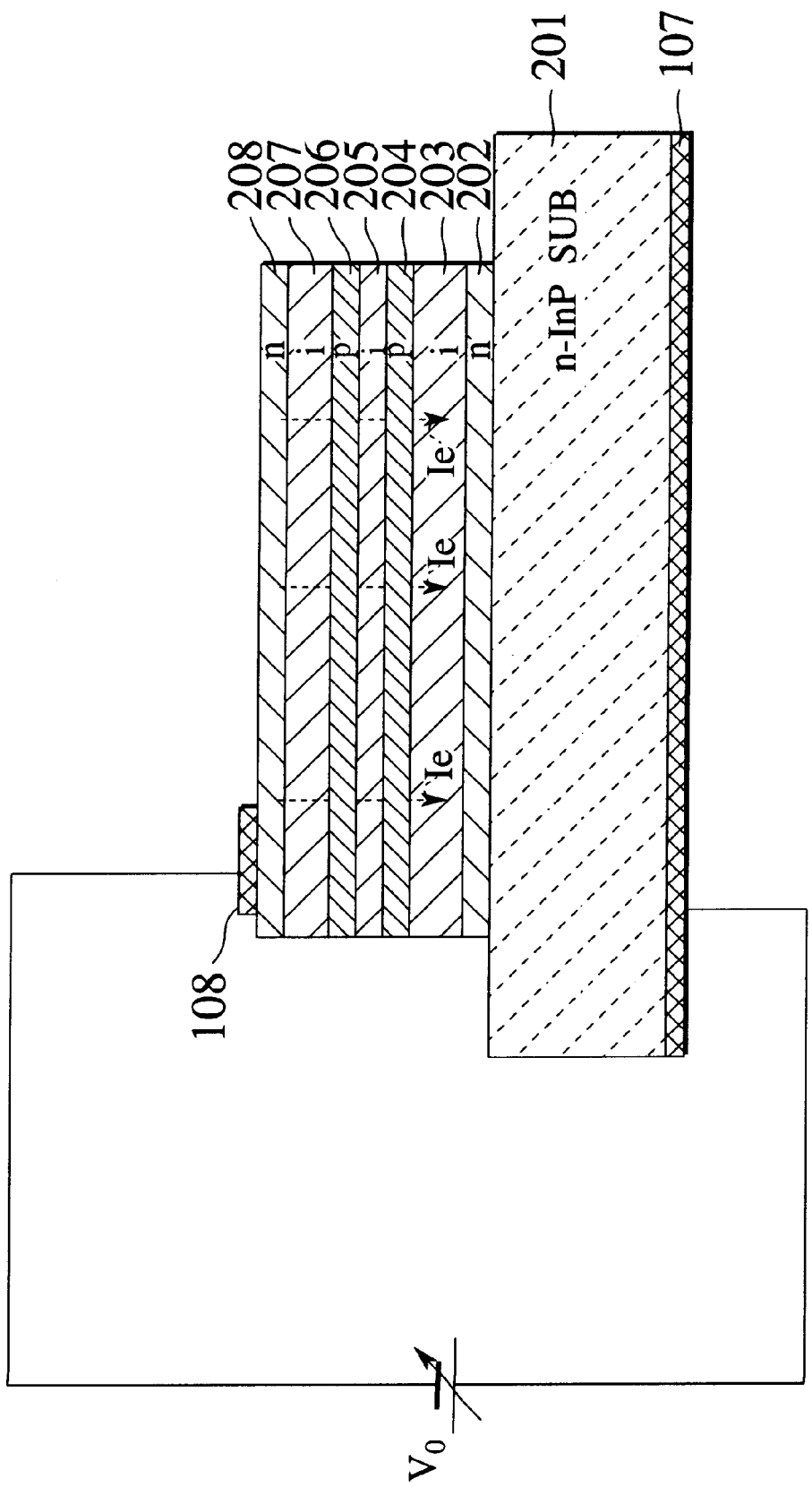
FIG. 18 is a schematic cross sectional view showing a unit cell of a semiconductor memory according to a third embodiment of the present invention.

FIG. 18 is a schematic cross sectional view showing a unit cell (memory cell) according to a third embodiment of the present invention. The memory cell has a common structure to the semiconductor memory structure according to the first (or the second) embodiment of the present invention. The memory cell according to a third embodiment of the present invention comprises a first semiconductor layer 202, a second semiconductor layer 203, a third semiconductor layer 204, a fourth semiconductor layer 207 and a fifth semiconductor layer 208 on and an n-InP substrate 201. The first to fifth semiconductor layers are stacked on the n-InP substrate 201 in this stacking order. The memory cell further has an additional structure which includes a sixth semiconductor layer 205 and a seventh semiconductor layer 207 between the third semiconductor layer 204 and the fourth semiconductor layer 207 as shown in FIG. 18. The sixth semiconductor layer 205 adjoins the third semiconductor layer 204, and the seventh semiconductor layer 206 adjoins the fourth semiconductor layer 207. In a definite manner, an n-InGaAs layer (thickness: about 1 $\mu$m; impurity concentration: $2.0 \times 10^{18}$ cm$^{-3}$) 202, an i-InGaAs layer (thickness: about 0.5 $\mu$m) 203, a p-InGaAs layer (thickness: about 6 nm; impurity concentration: $2.0 \times 10^{18}$ cm$^{-3}$) 204, an i-InGaAs layer (thickness: about 0.5 $\mu$m) 205, an n-InGaAs layer (thickness: about 1 $\mu$m; impurity concentration: $2.0 \times 10^{18}$ cm$^{-3}$) 206, an i-InGaAs layer (thickness: about 0.5 $\mu$m) 207 and an n-InGaAs layer (thickness: about 1 $\mu$m; impurity concentration: $2.0 \times 10^{18}$ cm$^{-3}$) 208 are disposed on the n-InP substrate 201 in this order. The n-InP layer 201 corresponds to a drain region, and the n-InGaAs layer 208 corresponds to a source region. A source electrode 108 is formed partially on the top surface of the n-InGaAs layer 208, and a drain electrode 107 is formed on the bottom surface of the n-InP substrate 201. The p-InGaAs layer 204, i-InGaAs layer 205 and p-InGaAs layer 206 serve as gate regions, and the gate regions 204, 205 and 206 are in floating states. A bias voltage $V_O$ is applied between the source electrode 108 and the drain electrode 107.

Figure 19:
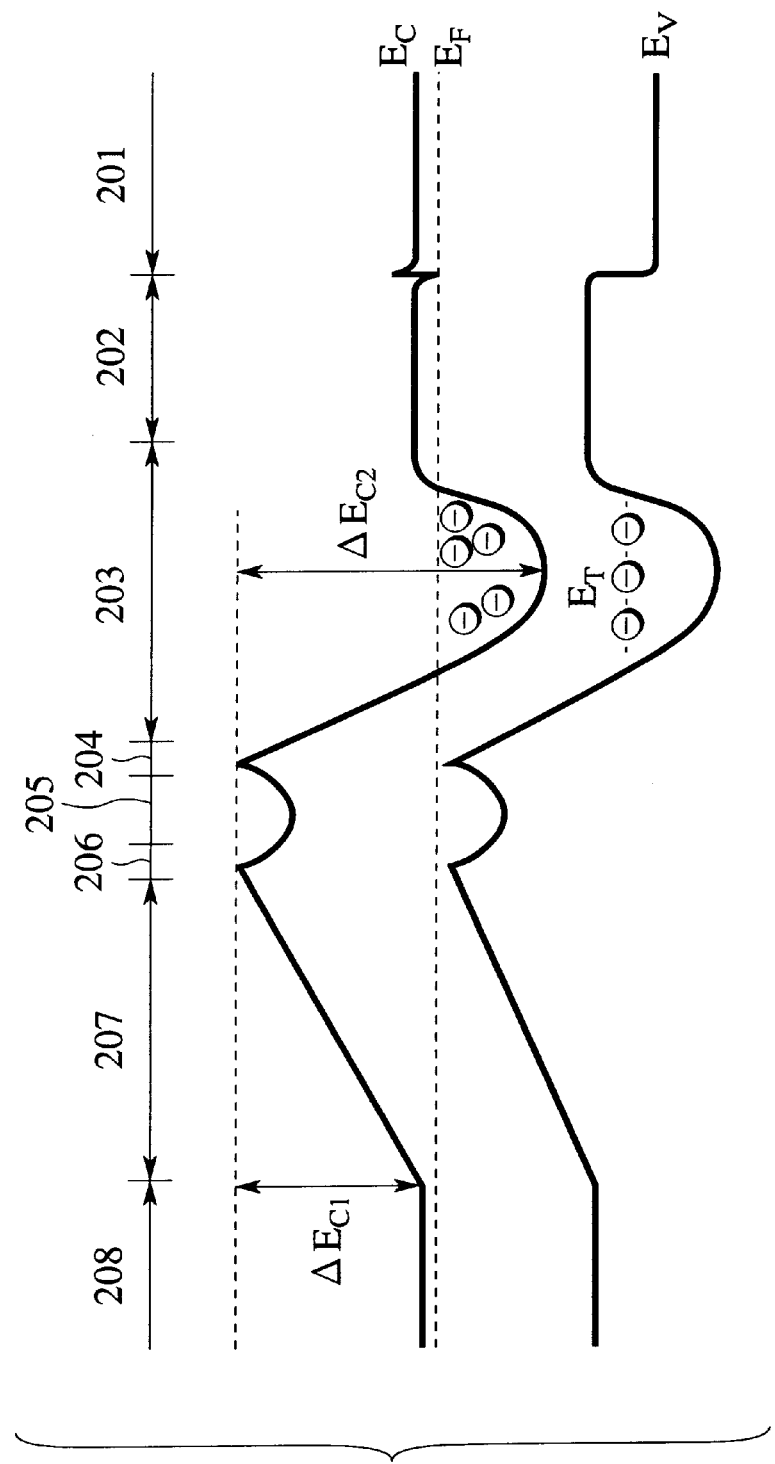
FIG. 19 is a band diagram of the unit cell of the semiconductor memory according to the third embodiment of the present invention at zero bias.

FIG. 19 is a corresponding band diagram showing a potential at zero bias, in which each of the conduction band edge $E_C$ and the valence band edge $E_V$ in the n-InP substrate 201, n-InGaAs layer 202, i-InGaAs layer 203, p-InGaAs layer 204, i-InGaAs layer 205, p-InGaAs layer 206, i-InGaAs layer 207 and n-InGaAs layer 208 is shown from right in turn. A broken line in FIG. 19 represents a Fermi energy level $E_F$. It is also assumed that a trap level $E_T$ (or trap levels $E_t$s) similar to that stated in the first or second embodiment is (are) present with in the forbidden gap.

In the following explanation of the semiconductor memory according to the third embodiment of the present invention, it is assumed that charges have been already stored in the i-InGaAs layer 203 so that the band structure has been asymmetry (and some electrons are assumed to have been trapped at the trap level $E_T$ within the forbidden gap of the i-InGaAs layer 203). Thus, in the case where the p-InGaAs layers 204 and 206 are considered as barriers over which electrons must surmount, a barrier height seen from the n-InGaAs layer 208 is $\Delta E_{C1}$, and another barrier height seen from the i-InGaAs layer 203 is $\Delta E_{C2}$ ($\Delta E_{C1} < \Delta E_{C2}$).

In the case where a negative bias voltage $V_O$ is applied to the n-InGaAs layer 208 as shown in FIG. 18, as well as those in the first and the second embodiments, electrons or the majority carriers present in the n-InGaAs layer 203 can also move beyond the energy barrier height $\Delta E_{C1}$ when a given voltage of $-V_2$ or more is applied, and the current $I_e$ may flow.

To the contrary, in the case where a positive bias voltage of $V_O$ is applied to the n-InGaAs layer 208, as electrons or the majority carriers present in the i-InGaAs layer 203 can not move beyond the energy barrier height $\Delta E_{C2}$ when the voltage of $+V_2$ is applied, the current $I_e$ may not flow. In the case where the bias voltage $V_O$ is increased from $+V_2$ to $+V_1$, as the energy barrier height $\Delta E_{C2}$ decreases, electrons or the majority carriers present in the n-InGaAs layer 203 can move beyond the energy barrier, and the current $I_e$ may flow. At the moment, the electrons which moved through the p-InGaAs layer 204 and the p-InGaAs layer 206 cause the electron avalanche in the i-InGaAs layer 207, generating a number of electrons and holes. The resultant holes move toward the p-InGaAs layers 204 and 206 or gate regions, and are stored therein, whereby the potentials in the p-InGaAs layers 204 and 206 are reduced and the energy barrier height $\Delta E_{C2}$ is decreased. Thus, more electrons may move beyond the barrier, causing a further electron avalanche to generate holes. A negative resistance may be caused by an abrupt increase of the current due to the above positive feedback. The voltage at which a current may start to flow is called a threshold voltage. In the semiconductor memory of the third embodiment according to the present invention, the electrons which has a large energy due to the avalanche multiplication are stored in the i-InGaAs layer 207, and the electrons which are stored in the i-InGaAs layer 203 recombine with holes and disappear. At this moment, the electrons which are trapped at the trap level $E_T$ in the forbidden gap of the i-InGaAs layer 203 also disappear (the disappearance of the electrons trapped at the trap level $E_T$ in the i-InGaAs layer 203 may be ascribable to the recombination with the generated holes). Some electrons are newly trapped at neighboring trap level $E_T$ in the forbidden gap of the i-InGaAs layer 207. When removing the bias voltage again, the asymmetry of the band becomes opposite to that at the time of zero bias, and the $\Delta E_{C1}$ and $\Delta E_{C2}$ exhibit opposite values to those at the time of zero bias. Thus, the negative resistance may be caused when the n-InGaAs layer 208 is biased negatively. It is possible to determine in which one of the i-InGaAs layers the electrons are stored, whereby a memory which employs the stored states to retain information may be realized. The stored states may be easily alternated with a state of the bias voltage.

A memory cell array may be formed by disposing a plurality of memory cells, each having the multi-layer structure shown in FIG. 18 on a semi-insulating semiconductor substrate, similar to the configuration shown in FIGS. 13 and 14. A matrix is constructed by crossing a plural of column lines (bit lines) and a plural of row lines (word lines) perpendicularly to each other, in which the n-InGaAs layer 208 is connected with one of the word lines, and the n-InGaAs layer 202 with one of the bit lines. The unit cell (memory cell) of the semiconductor memory according to the third embodiment of the present invention may be individually accessed at random if the unit cells are arranged at the cross points of the matrix which consists of a plural of the bit lines and a plural of the word lines crossing perpendicularly to each other. An optical device matrix facing to the cell matrix may be provided for supplying a light pulse to each cell.

FOURTH EMBODIMENT

Figure 20:
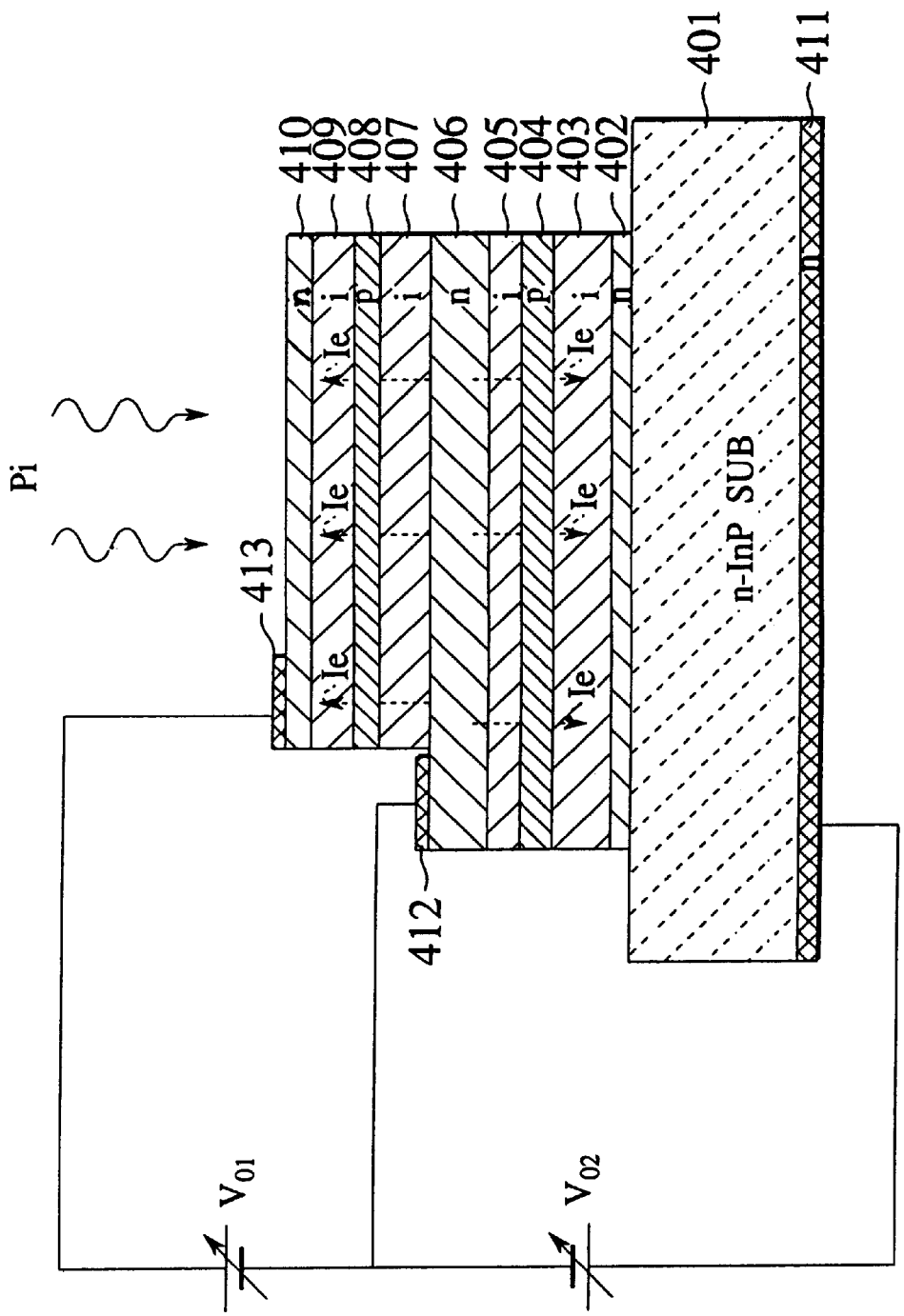
FIG. 20 is a schematic cross sectional view showing a unit cell of a semiconductor memory according to a fourth embodiment of the present invention.

FIG. 20 is a schematic cross sectional view showing a case where unit cells (memory cells) according to a fourth embodiment of the present invention are stacked vertically. The memory cell has a multi-layer structure comprising a first semiconductor layer 402, a second semiconductor layer 403, a third semiconductor layer 404, a fourth semiconductor layer 405, a fifth semiconductor layer 406, a sixth semiconductor layer 407, a seventh semiconductor layer 408, an eighth semiconductor layer 409 and ninth semiconductor layer 410 and an n-InP substrate 401. The first to ninth semiconductor layers are stacked on the n-InP substrate 401 in this stacking order. In a definite manner, an n-InGaAs layer (thickness: about 1 $\mu$m; impurity concentration: $2.0 \times 10^{18}$ cm$^{-3}$) 402, an i-InGaAs layer (thickness: about 0.5 $\mu$m) 403, a p-InGaAs layer (thickness: about 6 nm; impurity concentration: $2.0 \times 10^{18}$ cm$^{-3}$) 404, an i-InGaAs layer (thickness: about 0.5 $\mu$m) 405, an n-InGaAs layer (thickness: about 1 $\mu$m; impurity concentration: $2.0 \times 10^{18}$ cm$^{-3}$) 406, an i-InGaAs layer (thickness: about 0.5 $\mu$m) 407, a p-InGaAs layer (thickness: about 1 $\mu$m; impurity concentration: $2.0 \times 10^{18}$ cm$^{-3}$) 408, an i-InGaAs layer (thickness: about 0.5 $\mu$m) 409 and an n-InGaAs layer (thickness: about 1 $\mu$m; impurity concentration: $2.0 \times 10^{18}$ cm$^{-3}$) 410 are disposed on the n-InP substrate 401 in this order. The n-InGaAs layer 410 corresponds to a first drain region, and the n-InP layer 401 corresponds to a second drain region. The n-InGaAs layer 406 corresponds to a source region. A first drain electrode 413 is formed on the top surface of the n-InGaAs layer 410, and a second drain electrode 411 is formed on the bottom surface of the n-InP substrate 401. A source electrode 412 is formed on the central n-InGaAs layer 406. The p-InGaAs layer 408 serves as a first gate region and the p-InGaAs layer 404 as a second gate region. These gate regions 408 and 404 are in floating states. A bias voltage $V_{O1}$ is applied between the source electrode 412 and the first drain electrode 413, and another bias voltage $V_{O2}$ is applied between the source electrode 412 and the second drain electrode 411. Thus, in the fourth embodiment of the present invention, a first unit cell is composed between the first drain electrode 413 and the source electrode 412 and a second unit cell is composed between the second drain electrode 411 and the source electrode 412 so that the first and second unit cells are connected to each other in the depth direction, whereby a three-dimensional matrix configuration is constructed.

A memory cell array may be formed by disposing a plurality of memory cells, each having the multi-layer structure shown in FIG. 20 on a semi-insulating semiconductor substrate, similar to the configurations shown in FIGS. 13 and 14. A matrix is constructed with first and second column lines (bit lines) and row lines (word lines) crossing perpendicularly to the first and second column lines. The multi-layer structures shown in FIG. 20 may be located at cross points of the matrix. A three-dimensional semiconductor memory may be completed by connecting one of the bit line with the source electrode 412, by connecting one of the first word lines with the first drain electrode 413 and by connecting one of the second word lines with the second drain electrode 411. In addition, a matrix which consists of optical devices facing to the cell matrix may also be disposed for supplying a light pulse to each cell. Thus, each unit cell (memory cell) of the semiconductor memory according to the fourth embodiment of the present invention may be individually accessed at random if the unit cells are arranged at the cross points of the matrix which consists of a plural of the bit lines and a plural of the word lines crossing perpendicularly to each other.

A three-dimensional matrix which has a higher integration density may be realized by stacking a third, a fourth, . . . unit cells in the depth direction following the first and second unit cells, and by connecting them with a third, a fourth, . . . column lines (bit lines).

FIFTH EMBODIMENT

Figure 21:
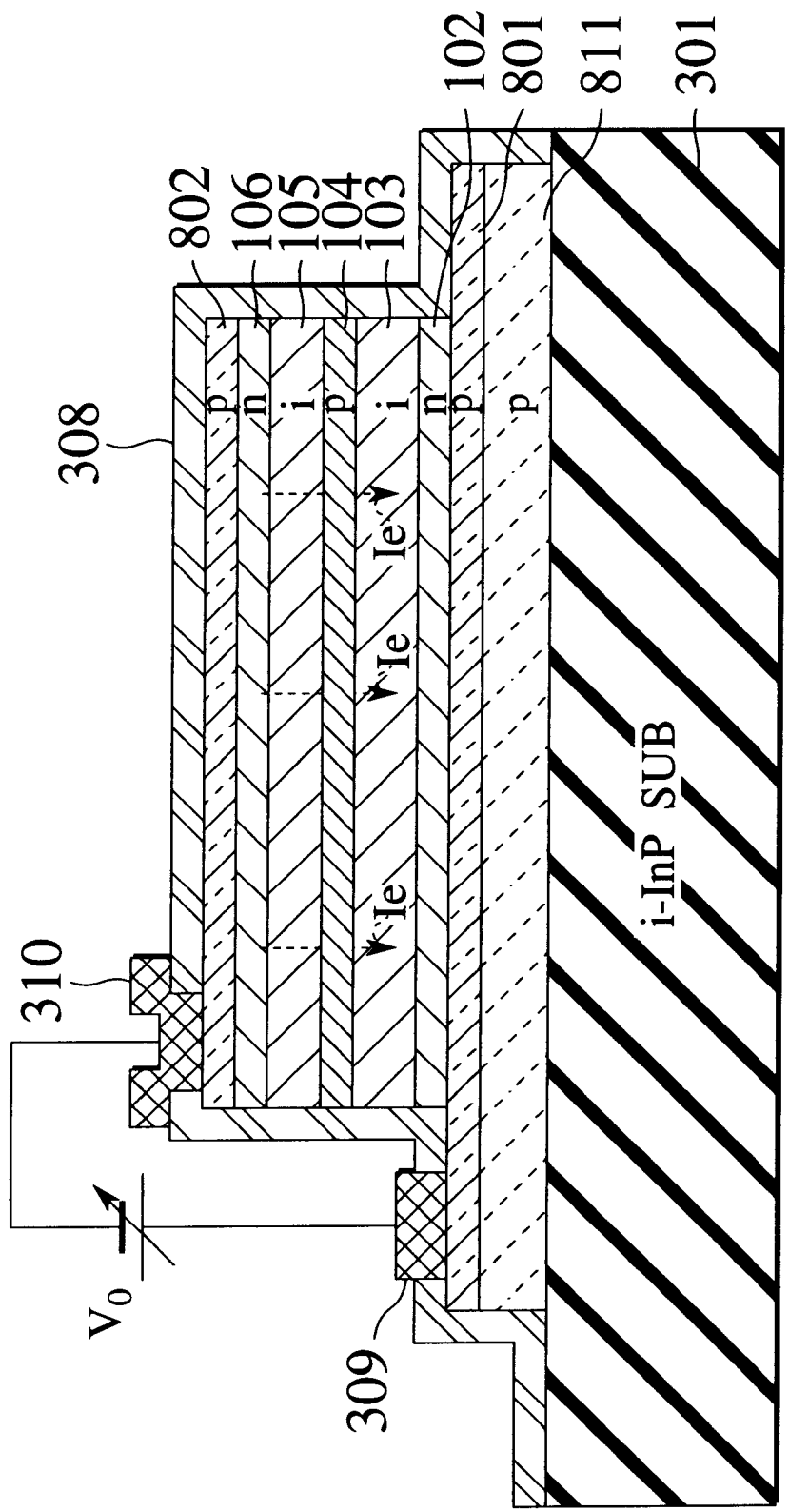
FIG. 21 is a schematic cross sectional view showing a unit cell of a semiconductor memory according to a fifth embodiment of the present invention.

FIG. 21 is a schematic cross sectional view showing a unit cell (memory cell) according to a fifth embodiment of the present invention. The memory cell comprises a p-InP layer (thickness: about 1 $\mu$m; impurity concentration: $2.0 \times 10^{16}$ cm$^{-3}$) 811, a p-InGaAs layer (thickness: about 1 $\mu$m; impurity concentration: $2.0 \times 10^{17}$ cm$^{-3}$) 801, an n-InGaAs layer (thickness: about 0.3 $\mu$m; impurity concentration: $2.0 \times 10^{18}$ cm$^{-3}$) 102, an i-InGaAs layer (thickness: about 0.5 $\mu$m) 103, a p-InGaAs layer (thickness: about 6 nm; impurity concentration: $2.0 \times 10^{18}$ cm$^{-3}$) 104, an i-InGaAs layer (thickness: about 0.5 $\mu$m) 105, an n-InGaAs layer (thickness: about 0.3 $\mu$m; impurity concentration: $2.0 \times 10^{18}$ cm$^{-3}$) 106, a p-InGaAs layer (thickness: about 1 $\mu$m; impurity concentration: $2.0 \times 10^{17}$ cm$^{-3}$) 802 and the i-InP substrate 301 in this order. A word electrode 310 is formed on the surface of the p-InGaAs layer 802, and a bit line 309 is formed on the p-InGaAs layer 801. The n-InGaAs layer 801 corresponds to a drain region, and the p-InGaAs layer 802 corresponds to a source region. The p-InGaAs layer 104 serves as a gate region The gate region 104 is held in a floating state. A bias voltage $V_0$ is applied between the word electrode 310 and the bit line 309.

Figure 22:
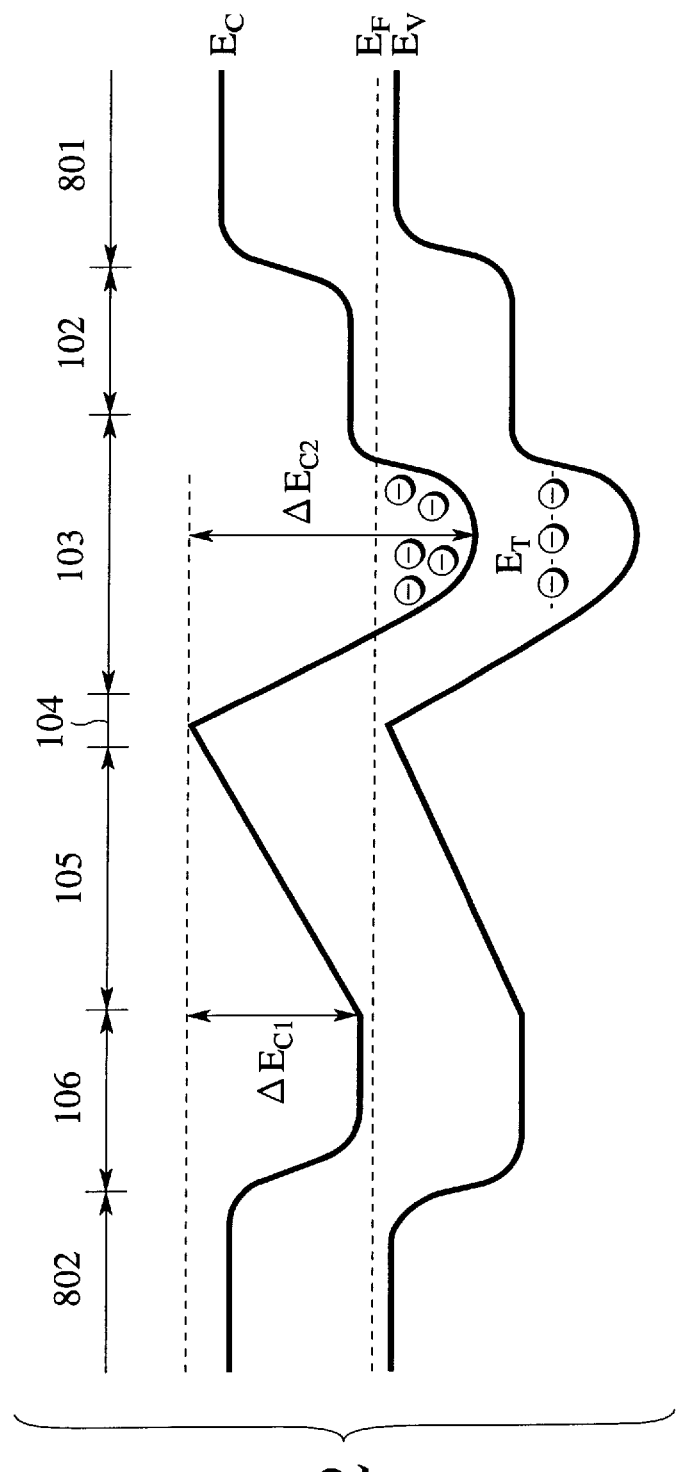
FIG. 22 is a band diagram of the unit cell of the semiconductor memory according to the fifth embodiment of the present invention at zero bias.

FIG. 22 is a corresponding band diagram showing a potential at zero bias, in which each of the conduction band edge $E_C$ and the valence band edge $E_V$ in the p-InGaAs layer 801, n-InGaAs layer 102, i-InGaAs layer 103, p-InGaAs layer 104, i-InGaAs layer 105, n-InGaAs layer 106 and p-InGaAs layer 802 is shown from right in turn. A broken line in the forbidden gap (energy gap band) between the conduction band and the valence band in FIG. 22 designates a Fermi energy level $E_F$ at zero bias. It is assumed that a trap level $E_T$ (or trap levels $E_T$s) is (are) present in the forbidden gap.

It is obvious from the band diagram shown in FIG. 22 that, between the p-InGaAs layer 801 and the n-InGaAs layer 102, and between the n-InGaAs layer 106 and the p-InGaAs layer 802, there are formed auxiliary potential barriers which may prevent a leakage of carries stored in the i-InGaAs layer 103 or i-InGaAs layer 105 to the bit or word line in the case where an X-Y matrix is arranged. As a depth of an potential well formed in the i-InGaAs layer 103 or i-InGaAs layer 105 shown in FIG. 22 is not a sufficient level compared to a thermal energy at room temperature, it is anxious to cause a leakage of the carriers stored in the potential well to the bit or word line when the semiconductor chip is heated. Therefore, the retaining property of the memory is ensured by forming the auxiliary potential barriers against the bit and word line at the p-InGaAs layer 801/the n-InGaAs layer 102 interface and at the n-InGaAs layer 106/the p-InGaAs layer 802 interface as shown in FIG. 22.

Figure 23:
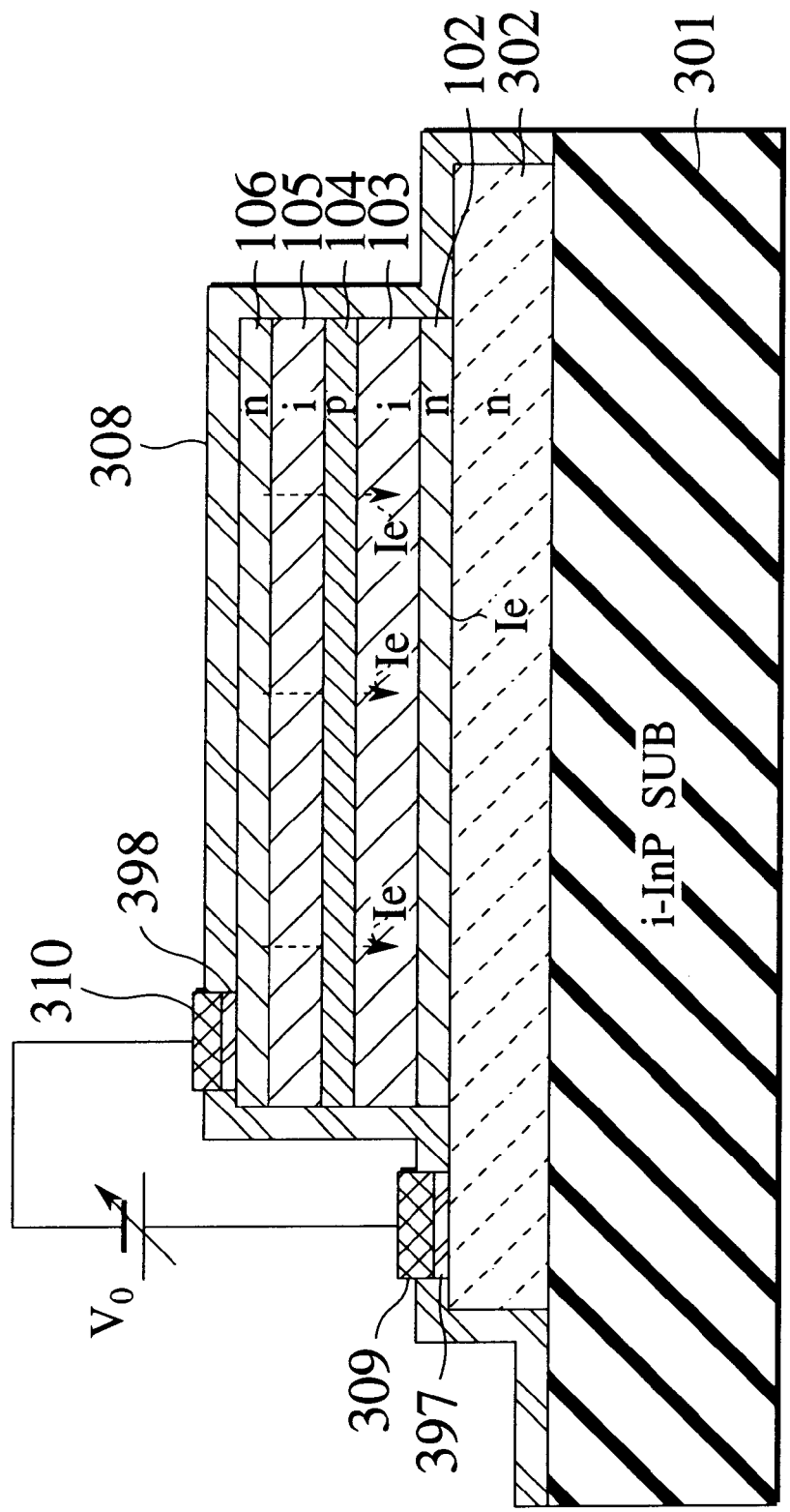
FIG. 23 is a schematic cross sectional view showing a unit cell of a semiconductor memory according to an alternative example based on the fifth embodiment of the present invention.

FIG. 23 is a schematic cross sectional view showing a unit cell (memory cell) according to an alternative example derived from the fifth embodiment of the present invention, in which a bit or word line is provided with a metal-insulator-semiconductor (MIS) structure. As well as in FIG. 13, a n-InP layer 302 having a thickness of about 0.5 $\mu$m, an n-InGaAs layer (thickness: about 1 $\mu$m; impurity concentration: $2.0 \times 10^{18}$ cm$^{-3}$) 102, an i-InGaAs layer (thickness: about 0.5 $\mu$m) 103, a p-InGaAs layer (thickness: about 6 nm; impurity concentration: $2.0 \times 10^{18}$ cm$^{-3}$) 104, an i-InGaAs layer (thickness: about 0.5 $\mu$m) 105, an n-InGaAs layer (thickness: about 1 $\mu$m; impurity concentration: $2.0 \times 10^{18}$ cm$^{-3}$) 106 are disposed on a semi-insulating substrate 301, or an i-InP substrate 301 in this order. An insulating film (thickness: about 0.2 $\mu$m) 308 such as a silicon nitride film (Si$_3$N$_4$ film) is deposited on the n-InGaAs layer 106. Insulating films 398 and 397 such as the silicon oxide films (SiO$_2$ films) having a thickness of 5 to 50 nm are formed in contact holes opened in the insulating film 308. Therefore, the word line 310 and the bit line 309 contact with the n-InGaAs layer 106 and the n-InP layer 302 through the insulating films (SiO$_2$ films) 398 and 397 to form MIS (MOS) structures, respectively. In the semiconductor memory according to the alternative example based on the fifth embodiment of the present invention, when a bias voltage having a given polarity and level is applied between the word line 310 and the bit line 309, a potential of the gate region (p-InGaAs layer) 104 which is kept in a floating state may be freely controlled. This is a memory cell of a voltage-driven type, which may be electrically coupled to the drain and source regions through a MIS junction. The stored carrier information may be read through a capacitance coupling by MIS (MOS) capacitors which may consist of the silicon oxide films 398 and 397. Hot electrons may be injected through the silicon oxide films (SiO$_2$ films) 398 and 397. If very thin silicon oxide films(SiO$_2$ film) 398 and 397 having a thickness less than of 5 nm, for example, are formed in contact holes opened in the insulating film 308, tunnel currents through the silicon oxide films (SiO$_2$ film) 398 and 397 may also be employed.

Figure 24:
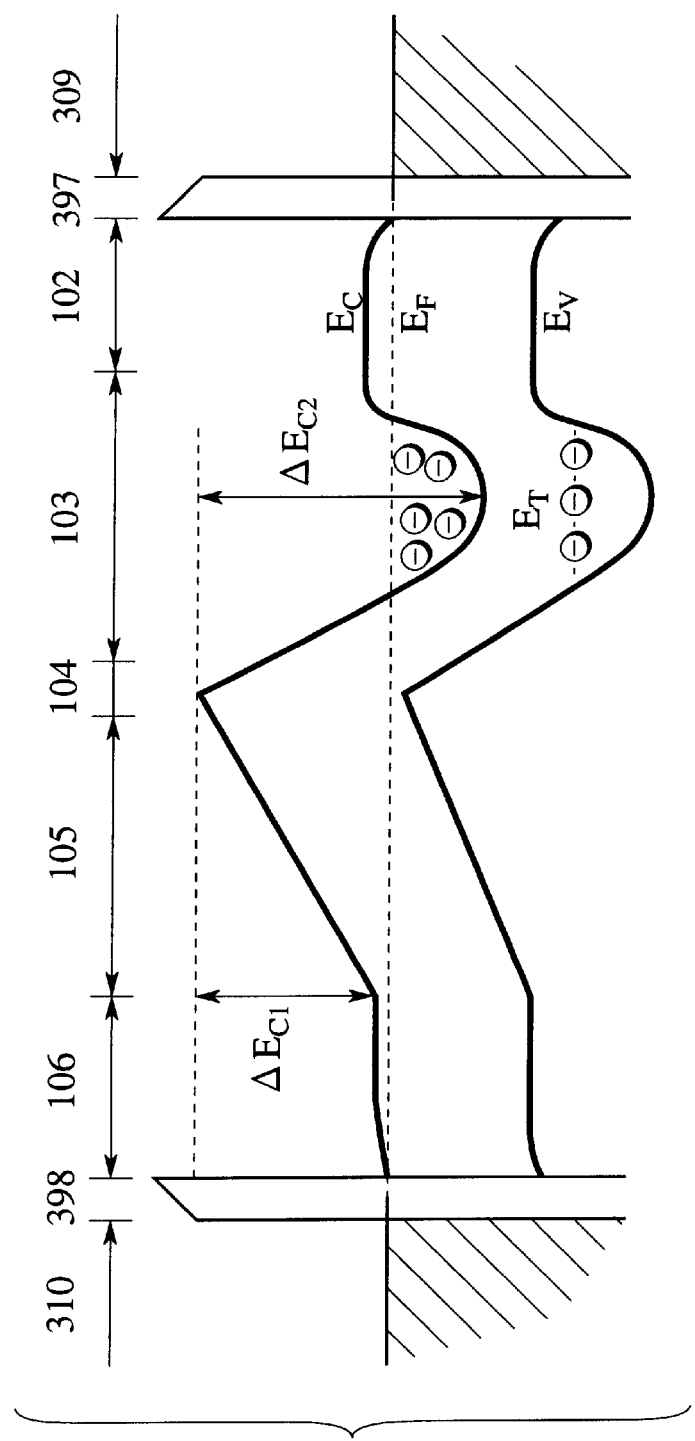
FIG. 24 is a band diagram of the unit cell of the semiconductor memory according to the alternative example based on the fifth embodiment of the present invention at zero bias.

FIG. 24 is a corresponding band diagram at zero bias, in which the same numeral references as those in FIG. 23 denote the same semiconductor layers. The anxiety for the carriers which are stored in the potential well and leak to the bit or word line may be solved by applying the band diagram shown in FIG. 24. That is, using the MIS junctions to form auxiliary potential barriers against the bit or word line, excellent retaining properties of the memory cell can be attained.

OTHER EMBODIMENT

Although the present invention is described with the first through fifth embodiments as above, it should not be understood that the description and the drawings may restrict the present invention. It is obvious to the skilled person in the art that various alternative embodiments, modifications and practical variations may be performed from the disclosure.

Figure 25:
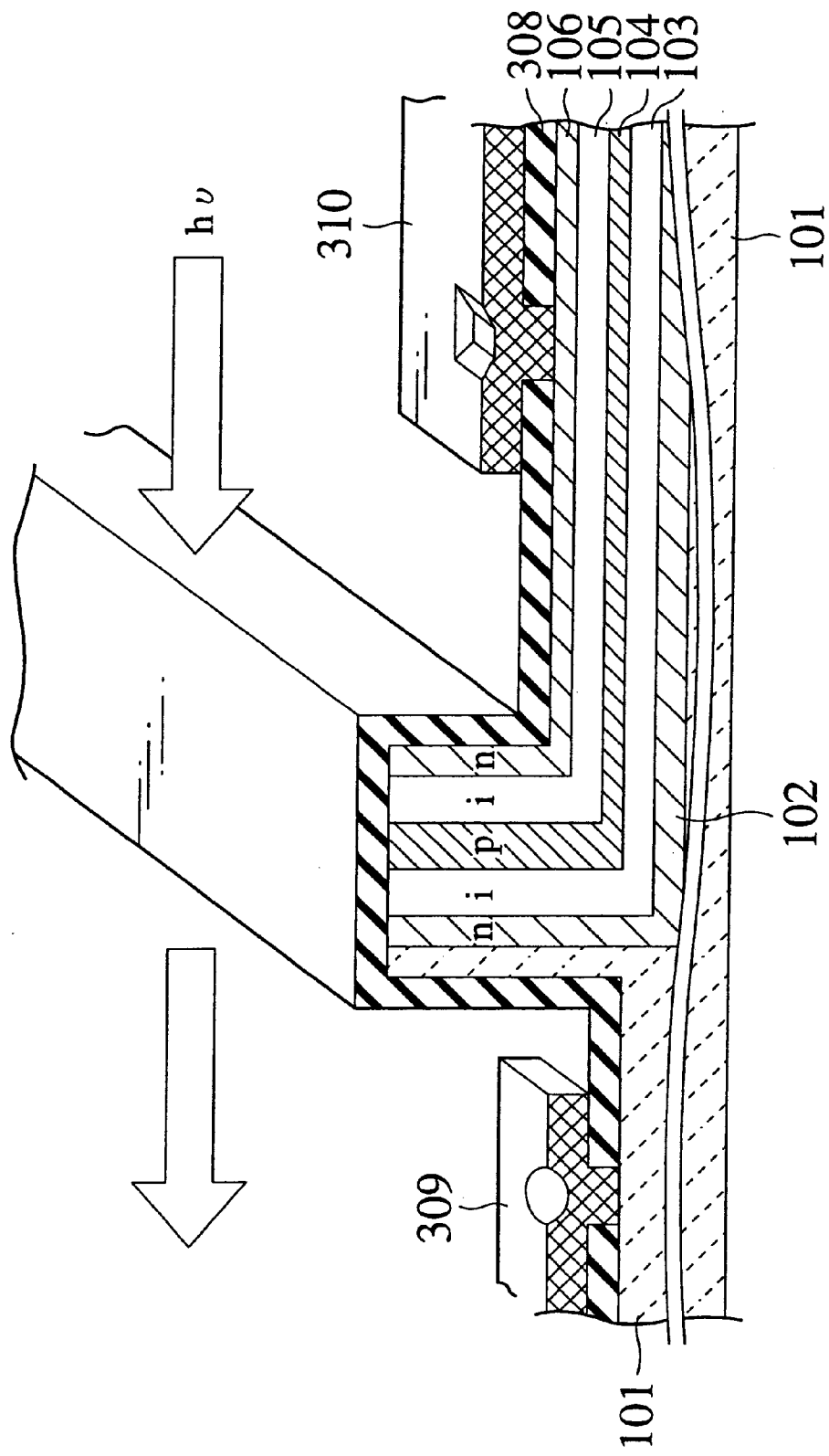
FIG. 25 is a schematic cross sectional view showing a unit cell of a semiconductor memory according to another embodiment of the present invention.

In the above explanation with respect to the first through fifth embodiments, although structures stacked in the thickness direction of the substrate is exemplified, another multi-layered structure formed on a sidewall of a protruding portion and stacked in a direction parallel to the surface of the substrate as shown in FIG. 25 may also be employed. The structure shown in FIG. 25 can realize a further sophisticated memory capable of being written with a coming light from an adjacent cell and logic circuits monolithically integrated on a same semiconductor chip.

The semiconductor memory shown in FIG. 25 can be fabricated in the following fabrication process.

(a) First, forming grooves on the n-InP substrate 101 by the RIE method to leave the protruding portion sandwiched between grooves. A width and a depth of the protruding portion may be controlled, for example, to 0.7 $\mu$m and 1.5 $\mu$m, respectively.

(b) Then, epitaxially growing, on a sidewall of the protruding portion of the n-InP substrate 101, an n-InGaAs layer (impurity concentration: $2.0 \times 10^{18}$ cm$^{-3}$) 102 with a thickness of about 2 $\mu$m, an n-InGaAs layer 103 with a thickness of about 0.5 $\mu$m, an n-InGaAs layer (impurity concentration: $2.0 \times 10^{18}$ cm$^{-3}$) 104 with a thickness of about 6 nm, an n-InGaAs layer 105 with a thickness of about 0.5 $\mu$m and an n-InGaAs layer (impurity concentration: $2.0 \times 10^{18}$ cm$^{-3}$) 106 with a thickness of about 1 $\mu$m sequentially in this turn. The sequential epitaxial growth on the sidewall is achieved preferably by the low pressure vapor phase epitaxial growth based on a surface adsorption reaction (chemical reaction), or the MLE method, rather than the MBE method based on a vapor deposition (physical reaction). According to the MLE method, in particular, it is possible to control a film thickness in every molecular layer as well as a nice step coverage.

(c) Thereafter, polishing the surface of the sequential epitaxial growth structure until the n-InP substrate 101 appears by using the CMP method.

(d) Further, etching selectively the left hand side of the protruding portion, and removing the n-InP substrate 101 located at the left hand side of the protruding portion by using the RIE method (in some situations, the n-InP substrate 101 located at the left hand side of the protruding portion may also be left to form a thin layer) with an aid of photolithography technique.

(e) Then, forming an insulated layer 308 over an upper area, sidewalls of the protruding portion, which is the remaining epitaxial growth structure consisting of n-InGaAs layer 102, i-InGaAs layer 103, p-InGaAs layer 104, i-InGaAs layer 105 and n-InGaAs layer 106. The insulated layer 308 may also deposited by CVD method on the flat portion or the bottom portion of the recess.

(f) Finally, opening a bit line contact hole and a word line contact hole in the insulated layer 308 at the bottom of the recess by the RIE method and photolithography technique as shown in FIG. 25. Then, the semiconductor memory shown in FIG. 25 is completed by forming the bit line 309 and the word line 310 by means of the so-called lift-off method, in which a multi-layered metallic film such as Pt/Ti/Pt/Au or AuGe/Ni/Ti/Au is deposited over the entire surface by the vacuum evaporation or sputtering with the remaining pattern of photoresist used for opening the bit line and the word line contact holes, and then the photoresist is removed.

The semiconductor memory shown in FIG. 25 may also be used as a semiconductor memory which can accumulate electrons and holes within the internal of the semiconductor stacked structure by applying a high electric field to cause the avalanche multiplication in the semiconductor layer. The semiconductor memory shown in FIG. 25 may also be used as a memory capable of writing electrically and optically and of retaining information for a certain time period after removing the power supply as well as the first through fifth embodiments. It is also possible to erase the stored information electrically and optically both in a high speed. The device is further useful as an optical memory capable of reading optically by merging the light modulating device and light emitting device internally in the same semiconductor chip. A large bit density memory may also be provided because an extremely large number of the memory cells can be integrated easily in two- and three-dimensions.

In the first to fifth embodiments, although there is described the case where only electrons are accumulated in the multi layered structure such as n-i-p-i-n structure, the carriers to be accumulated may also be holes. Further, the TBD portion for causing the avalanche multiplication within the i-layers on both sides in the structure may not be only n-i-p-i-n but p-i-n-i-p, n-i-p-i-p-i-n and p-i-n-i-n-i-p as well. Although the so-called "$\delta$-doped layer" whose semiconductor layer in the central portion has a very thin thickness with very high impurity concentration is described in the first to fifth embodiments, the thickness of the doped layer may be relatively thicker as far as it is possible to cause the avalanche multiplication and to accumulate electrons and/or holes. The i-layer may have a multi-quantum well structure, and the "quantum confinement (Stark effect)" in the multi-quantum well structure may also be used. In this case, if the holes, in general, having large mass are used as majority carriers, it is possible to reduce the mass and to obtain a high speed operation by introducing strains. Other complicated and sophisticated functions may be performed by connecting the present device with other devices.

Although the InGaAs based compound semiconductor is used as the example of the material, other materials such as a semiconductor having a non-lattice-matching system, and other silicon based materials may also be applied. If necessary, an etching-stop layer such as an InP may be inserted in the multi-layered structure to ease the fabrication process increasing the accuracy of the thickness, which can perform the same functions and operations and show the same technical advantages as the first to fifth embodiments.

Thus, it should be noted that the present invention may include various modifications of embodiments not described, and it is to be understood that the present invention is not limited to the specific embodiments thereof except as defined in the appended claims.

What is claimed is:

1. A semiconductor memory having a unit cell, said unit cell comprising a stacked structure including:

a first semiconductor layer of a first conductivity type;

a second semiconductor layer of an intrinsic type disposed on the first semiconductor layer so that conduction and valance band edges smoothly continue to those of the first semiconductor layer respectively;

a third semiconductor layer of a second conductivity type opposite to said first conductivity type, being held in an electrically floating state, disposed on the second semiconductor layer so that conduction and valance band edges smoothly increase from those of the second semiconductor layer respectively so as to have a potential maximum of band diagram in the third semiconductor layer;

a fourth semiconductor layer of said intrinsic type disposed on the third semiconductor layer so that conduction and valance band edges smoothly decrease from those of the third semiconductor layer respectively; and a fifth semiconductor layer of said first conductivity type disposed on the fourth semiconductor layer so that conduction and valance band edges smoothly continue to those of the fourth semiconductor layer respectively, wherein a voltage is applied between said first and fifth semiconductor layers so that a potential barrier height defined by the potential maximum varies with a polarity and a level of said voltage, configured such that majority carriers surmount the potential maximum.

2. The semiconductor memory of claim 1, wherein said potential barrier height is further varied under light irradiation.

3. The semiconductor memory of claim 1 wherein charges are stored in said second or fourth semiconductor layer by controlling said potential barrier height, whereby information can be retained in accordance with said stored state of said charges.

4. A semiconductor memory having a unit cell, said unit cell comprising a stacked structure including:

a first semiconductor layer of a first conductivity type;

a second semiconductor layer of an intrinsic type disposed on the first semiconductor layer so that conduction and valance band edges smoothly continue to those of the first semiconductor layer respectively;

a third semiconductor layer of a second conductivity type opposite to said first conductivity type, being held in an electrically floating state, disposed on the second semiconductor layer so that conduction and valance band edges smoothly increase from those of the second semiconductor layer respectively so as to have a first potential maximum of band diagram in the third semiconductor layer;

a fourth semiconductor layer of said intrinsic type adjoining said third semiconductor layer so that conduction and valance band edges smoothly continue to those of the third semiconductor layer respectively;

a fifth semiconductor layer of said second conductivity type adjoining said fourth semiconductor layer so that conduction and valance band edges smoothly increase from those of the fourth semiconductor layer respectively so as to have a second potential maximum of band diagram in the fifth semiconductor layer;

a sixth semiconductor layer of said intrinsic type disposed on the fifth semiconductor layer so that conduction and valance band edges smoothly decrease from those of the fifth semiconductor layer respectively; and a seventh semiconductor layer of said first conductivity type disposed on the sixth semiconductor layer so that conduction and valance band edges smoothly continue to those of the sixth semiconductor layer respectively;

wherein a voltage is applied between said first and seventh semiconductor layers so that a potential barrier height defined by the first and second potential maxima varies with a polarity and a level of said voltage, configured such that majority carriers surmount the first and second potential maxima.

5. A semiconductor memory having a multi-layer structure, said structure comprising, in a stacked manner in turn:

a first semiconductor layer of a first conductivity type;

a second semiconductor layer of an intrinsic type disposed on the first semiconductor layer so that conduction and valance band edges smoothly continue to those of the first semiconductor layer respectively;

a third semiconductor layer of a second conductivity type opposite to said first conductivity type, being held in an electrically floating state, disposed on the second semiconductor layer so that conduction and valance band edges smoothly increase from those of the second semiconductor layer respectively so as to have a first potential maximum of band diagram in the third semiconductor layer;

a fourth semiconductor layer of said intrinsic type disposed on the third semiconductor layer so that conduction and valance band edges smoothly decreased from those of the third semiconductor layer respectively;

a fifth semiconductor layer of said first conductivity type disposed on the fourth semiconductor layer so that conduction and valance band edges smoothly continue to those of the fourth semiconductor layer respectively;

a sixth semiconductor layer of said intrinsic type disposed on the fifth semiconductor layer so that conduction and valance band edges smoothly continue to those of the fifth semiconductor layer respectively;

a seventh semiconductor layer of said second conductivity type, being held in the electrically floating state, disposed on the sixth semiconductor layer so that conduction and valance band edges smoothly increase from those of the sixth semiconductor layer respectively so as to have a second potential maximum of band diagram in the seventh semiconductor layer;

an eighth semiconductor layer of said intrinsic type disposed on the seventh semiconductor layer so that conduction and valance band edges smoothly decrease from those of the seventh semiconductor layer respectively; and a ninth semiconductor layer of said first conductivity type disposed on the eighth semiconductor layer so that conduction and valance band edges smoothly continue to those of the eight semiconductor layer respectively, wherein a first voltage is applied between said ninth and fifth semiconductor layer so that a first potential barrier height defined by the second potential maximum is varied with a polarity and a level of said first voltage and a second voltage is applied between said first and fifth semiconductor layers so that a second potential barrier height defined by the first potential maximum is varied with the polarity and the level of said second voltage, configured such that majority carriers surmount the first and second potential maximum, respectively.

6. The semiconductor memory of claim 5, wherein said first and second potential barrier heights are further varied under light irradiation, respectively.

7. The semiconductor memory of claim 5 wherein charges are stored in said sixth or eighth semiconductor layer by controlling said first potential barrier height, and charges are also stored in said second or fourth semiconductor layer by controlling said height of said second potential barrier, whereby information can be retained in accordance with said stored states of said charges.

8. The semiconductor memory of claim 1 further comprising a matrix consisting of column lines and row lines crossing perpendicularly to each other, wherein a plurality of said unit cells are located at cross points in said matrix.

9. The semiconductor memory of claim 8, wherein said first semiconductor layer is connected electrically to one of said column lines, and said fifth semiconductor layer is connected electrically to one of said row lines.

10. The semiconductor memory of claim 5 further comprising a matrix consisting of first and second column lines and row lines crossing perpendicularly to said first and second column lines, wherein a plurality of said multi-layer structures are located at cross points in said matrix.

11. The semiconductor memory of claim 10, wherein one of said first column lines, one of said second column lines and one of said row lines are connected electrically to said first semiconductor layer, said ninth semiconductor layer and said fifth semiconductor layer, respectively.

12. The semiconductor memory of claim 1 wherein a current-voltage characteristic between said first and fifth semiconductor layers exhibits an S-shaped negative resistance.

13. The semiconductor memory of claim 5 wherein a current-voltage characteristic between said fifth and ninth semiconductor layers exhibits an S-shaped negative resistance.

14. The semiconductor memory of claim 12 wherein said S-shaped characteristics are present in positive and negative polarities.

15. The semiconductor memory of claim 12 wherein a level of a threshold voltage of said S-shaped characteristic is used as a stored information.

16. The semiconductor memory of claim 1 wherein an avalanche multiplication is caused in said second and fourth semiconductor layers.

17. The semiconductor memory of claim 5 wherein an avalanche multiplication is caused in said second, fourth, sixth and eighth semiconductor layers.

18. The semiconductor memory of claim 1 wherein said first to fifth semiconductor layers are stacked on a top surface of a semiconductor substrate.

19. The semiconductor memory of claim 1 wherein said first to fifth semiconductor layers are stacked on a sidewall of a protruding portion of a semiconductor substrate.

20. The semiconductor memory of claim 9, wherein said first semiconductor layer is connected electrically to one of said column lines through an insulating film, and said fifth semiconductor layer is connected electrically to one of said row lines through an insulating film.

* * * * *

UNITED STATES PATENT AND TRADEMARK OFFICE
CERTIFICATE OF CORRECTION

PATENT NO. : 6,147,901
DATED : November 14, 2000
INVENTOR(S) : Haruhisa Sakata, et. al.

It is certified that error appears in the above-identified patent and that said Letters Patent is hereby corrected as shown below:

Column 8, line 48, change "A" to --Δ--.

Column 10, line 46, change "raw" to --row--.

Signed and Sealed this

First Day of May, 2001

Attest:

NICHOLAS P. GODICI

*Attesting Officer*   *Acting Director of the United States Patent and Trademark Office*